(12) United States Patent
Chen

(10) Patent No.: US 11,101,235 B2
(45) Date of Patent: *Aug. 24, 2021

(54) FABRICATION METHOD OF SEMICONDUCTOR PACKAGE WITH STACKED SEMICONDUCTOR CHIPS

(71) Applicant: Siliconware Precision Industries Co., Ltd., Taichung (TW)

(72) Inventor: Lu-Yi Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/742,040

(22) Filed: Jan. 14, 2020

(65) Prior Publication Data
US 2020/0152591 A1 May 14, 2020

Related U.S. Application Data

(62) Division of application No. 15/975,232, filed on May 9, 2018, now Pat. No. 10,622,323, which is a division
(Continued)

(30) Foreign Application Priority Data

May 11, 2012 (TW) .................. 101116801

(51) Int. Cl.
*H01L 23/00* (2006.01)
*H01L 21/768* (2006.01)
(Continued)

(52) U.S. Cl.
CPC ............ *H01L 24/13* (2013.01); *H01L 21/568* (2013.01); *H01L 21/6835* (2013.01); *H01L 21/76898* (2013.01); *H01L 23/147* (2013.01); *H01L 23/3675* (2013.01); *H01L 23/481* (2013.01); *H01L 23/49827* (2013.01); *H01L 23/525* (2013.01); *H01L 24/11* (2013.01); *H01L 24/17* (2013.01); *H01L 24/19* (2013.01); *H01L 24/20* (2013.01); *H01L 24/92* (2013.01); *H01L 24/96* (2013.01); *H01L 25/0657* (2013.01); *H01L 25/50* (2013.01); *H01L 21/563* (2013.01); *H01L 23/3128* (2013.01); *H01L 23/49816* (2013.01);
(Continued)

(58) Field of Classification Search
CPC .......................................... H01L 23/538–5389
See application file for complete search history.

(56) References Cited

U.S. PATENT DOCUMENTS 5,202,754 A 4/1993 Bertin et al.
5,270,261 A 12/1993 Bertin et al.
(Continued)

*Primary Examiner* — Shaun M Campbell
(74) *Attorney, Agent, or Firm* — Mintz Levin Cohn Ferris Glovsky and Popeo, P.C.; Peter F. Corless; Steven M. Jensen

(57) ABSTRACT

A semiconductor package includes a build-up structure; a semiconductor disposed on the build-up structure in a flip-chip manner and having a plurality of bumps penetrating therethrough; an electronic element disposed on the semiconductor chip; and an encapsulant formed on the build-up structure and encapsulating the semiconductor chip and the electronic element, thereby improving the product yield and the overall heat dissipating efficiency.

35 Claims, 28 Drawing Sheets

Related U.S. Application Data of application No. 13/628,549, filed on Sep. 27, 2012, now Pat. No. 9,997,481.

(51) Int. Cl.

| | | |
|---|---|---|
| *H01L 23/48* | (2006.01) | |
| *H01L 21/683* | (2006.01) | |
| *H01L 25/00* | (2006.01) | |
| *H01L 21/56* | (2006.01) | |
| *H01L 23/14* | (2006.01) | |
| *H01L 23/367* | (2006.01) | |
| *H01L 23/498* | (2006.01) | |
| *H01L 23/525* | (2006.01) | |
| *H01L 25/065* | (2006.01) | |
| *H01L 23/31* | (2006.01) | |

(52) U.S. Cl.
CPC .............. *H01L 24/05* (2013.01); *H01L 24/16* (2013.01); *H01L 24/29* (2013.01); *H01L 24/32* (2013.01); *H01L 24/81* (2013.01); *H01L 24/83* (2013.01); *H01L 24/97* (2013.01); *H01L 2221/68327* (2013.01); *H01L 2221/68359* (2013.01); *H01L 2221/68381* (2013.01); *H01L 2224/03912* (2013.01); *H01L 2224/0401* (2013.01); *H01L 2224/04105* (2013.01); *H01L 2224/0557* (2013.01); *H01L 2224/05552* (2013.01); *H01L 2224/05571* (2013.01); *H01L 2224/111* (2013.01); *H01L 2224/11003* (2013.01); *H01L 2224/1147* (2013.01); *H01L 2224/1184* (2013.01); *H01L 2224/11334* (2013.01); *H01L 2224/11849* (2013.01); *H01L 2224/12105* (2013.01); *H01L 2224/131* (2013.01); *H01L 2224/133* (2013.01); *H01L 2224/13009* (2013.01); *H01L 2224/1319* (2013.01); *H01L 2224/13021* (2013.01); *H01L 2224/13022* (2013.01); *H01L 2224/13023* (2013.01); *H01L 2224/13025* (2013.01); *H01L 2224/1329* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16146* (2013.01); *H01L 2224/16225* (2013.01); *H01L 2224/16227* (2013.01); *H01L 2224/16237* (2013.01); *H01L 2224/17181* (2013.01); *H01L 2224/211* (2013.01); *H01L 2224/293* (2013.01); *H01L 2224/2919* (2013.01); *H01L 2224/2929* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/81005* (2013.01); *H01L 2224/8185* (2013.01); *H01L 2224/81191* (2013.01); *H01L 2224/81193* (2013.01); *H01L 2224/81444* (2013.01); *H01L 2224/81801* (2013.01); *H01L 2224/81903* (2013.01); *H01L 2224/82101* (2013.01); *H01L 2224/83* (2013.01); *H01L 2224/831* (2013.01); *H01L 2224/83005* (2013.01); *H01L 2224/92* (2013.01); *H01L 2224/922* (2013.01); *H01L 2224/9202* (2013.01); *H01L 2224/97* (2013.01); *H01L 2225/06513* (2013.01); *H01L 2225/06517* (2013.01); *H01L 2225/06541* (2013.01); *H01L 2225/06589* (2013.01); *H01L 2924/00012* (2013.01); *H01L 2924/00014* (2013.01); *H01L 2924/15311* (2013.01); *H01L 2924/16152* (2013.01); *H01L 2924/18161* (2013.01); *H01L 2924/3511* (2013.01); *H01L 2924/3512* (2013.01)

(56) References Cited

U.S. PATENT DOCUMENTS

| | | | |
|---|---|---|---|
| 7,863,739 B2 | 1/2011 | Lee et al. | |
| 8,176,628 B1 * | 5/2012 | Rusli | H01L 23/49816 29/852 |
| 10,622,323 B2 * | 4/2020 | Chen | H01L 24/13 |
| 2002/0173075 A1 | 11/2002 | Tie et al. | |
| 2003/0006062 A1 | 1/2003 | Stone et al. | |
| 2005/0046002 A1 | 3/2005 | Lee et al. | |
| 2005/0263869 A1 | 12/2005 | Tanaka et al. | |
| 2006/0081978 A1 | 4/2006 | Huang et al. | |
| 2008/0042261 A1 | 2/2008 | Wolter et al. | |
| 2008/0258306 A1 | 10/2008 | Chang et al. | |
| 2010/0059854 A1 * | 3/2010 | Lin | H01L 25/50 257/528 |
| 2010/0133704 A1 * | 6/2010 | Marimuthu | H01L 24/16 257/778 |
| 2012/0098123 A1 * | 4/2012 | Yu | H01L 23/49822 257/737 |
| 2012/0306073 A1 | 12/2012 | Yu et al. | |
| 2013/0037943 A1 * | 2/2013 | Yamano | H01L 24/03 257/737 |
| 2013/0249101 A1 * | 9/2013 | Lin | H01L 23/5389 257/773 |

\* cited by examiner

FABRICATION METHOD OF SEMICONDUCTOR PACKAGE WITH STACKED SEMICONDUCTOR CHIPS

CROSS-REFERENCE TO RELATED APPLICATION(S)

This application is a divisional of copending application U.S. Ser. No. 15/975,232, filed on May 9, 2018, which is a divisional of U.S. Ser. No. 13/628,549, filed on Sep. 27, 2012, which issued as U.S. Pat. No. 9,997,481, which claims under 35 U.S.C. § 119(a) the benefit of Taiwanese Application No. 101116801, filed on May 11. 2012, the entire contents of which are incorporated herein by reference.

BACKGROUND OF THE INVENTION

1. Field of the Invention

The present invention relates to semiconductor packages and fabrication methods thereof, and, more particularly, to a chip-stacked type semiconductor package and a fabrication method thereof.

2. Description of Related Art

Along with the rapid development of science and technologies, electronic products are developed towards miniaturization, multi-function, high electrical performance and high speed. To meet the trend, semiconductor packages are required to have minimized size, high performance and high speed.

According to a fabrication method of a semiconductor package as disclosed by U.S. Pat. Nos. 5,202,754 and 5,270,261, a wafer having an etch stop layer embedded therein is provided and bonded to a carrier. Then, the wafer is thinned by etching until the etch stop layer is exposed. Further, a plurality of through-silicon vias (TSV) are formed in the wafer, and conductive through holes are formed in the TSVs, respectively. Thereafter, the wafer is debonded from the carrier and singulated into a plurality of thinned semiconductor chips. Further, the semiconductor chips can be stacked to form a 3D-IC package having small size and high performance.

However, when the wafer is debonded from the carrier, the wafer can be easily cracked due to its reduced thickness. Further, the bonding and debonding processes can easily cause cracking or damage of the wafer. Furthermore, since the conventional method bonds the entire wafer instead of known good dies to the carrier, the overall fabrication cost is increased. In addition, warpage can easily occur to the thinned wafer, thus adversely affecting subsequent bonding processes.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a build-up structure having a plurality of conductive pads exposed from a top surface thereof; a first semiconductor chip disposed on the top surface of the build-up structure in a flip-chip manner, wherein the first semiconductor chip has a first active surface and a first non-active surface opposite to the first active surface, the first active surface has a plurality of first electrode pads electrically connected to the conductive pads, respectively, and a plurality of first through holes are formed in the first semiconductor chip via the first non-active surface thereof such that a plurality of first bumps are formed in the first through holes for electrically connecting the first electrode pads; an electronic element disposed on the first semiconductor chip and electrically connected to the first bumps; and an encapsulant formed on the top surface of the build-up structure for encapsulating the first semiconductor chip and the electronic element.

The present invention provides another semiconductor package, which comprises: a carrier having a plurality of conductive pads exposed from a top surface thereof; a first semiconductor chip disposed on the top surface of the carrier in a flip-chip manner, wherein the first semiconductor chip has a first active surface and a first non-active surface opposite to the first active surface, the first active surface has a plurality of first electrode pads electrically connected to the conductive pads, respectively, and a plurality of first through holes are formed in the first semiconductor chip via the first non-active surface thereof such that a plurality of first bumps are disposed in the first through holes for electrically connecting to the first electrode pads, and a heat conducting layer is further formed on the first non-active surface of the first semiconductor chip; an electronic element disposed on the first semiconductor chip and electrically connected to the first bumps; and an encapsulant formed on the top surface of the carrier for encapsulating the first semiconductor chip and the electronic element while exposing an edge of the heat conducting layer.

The present invention further provides a fabrication method of a semiconductor package, which comprises the steps of: providing a carrier having opposite first and second surfaces, wherein a build-up structure is formed on the first surface of the carrier and has a plurality of conductive pads exposed from the a top surface thereof; disposing a first semiconductor chip on the build-up structure in a flip-chip manner, wherein the first semiconductor chip has a first active surface and a first non-active surface opposite to the first active surface, and the first active surface has a plurality of first electrode pads electrically connected to the conductive pads, respectively; thinning the first semiconductor chip from the first non-active surface thereof; forming a plurality of first through holes in the first semiconductor chip via the first non-active surface thereof; forming in the first through holes a plurality of first bumps electrically connecting to the first electrode pads; disposing an electronic element on the first semiconductor chip and electrically connecting the electronic element and the first bumps; and forming an encapsulant on the build-up structure for encapsulating the first semiconductor chip and the electronic element.

The present invention provides another fabrication method of a semiconductor package, which comprises the steps of: providing a carrier having a first surface with a plurality of conductive pads and a second surface opposite to the first surface; disposing a first semiconductor chip on the first surface of the carrier in a flip-chip manner, wherein the first semiconductor chip has a first active surface and a first non-active surface opposite to the first active surface, and the first active surface has a plurality of first electrode pads electrically connected to the conductive pads, respectively; thinning the first semiconductor chip from the first non-active surface thereof; forming a plurality of first through holes in the first semiconductor chip via the first non-active surface thereof; forming in the first through holes a plurality of first bumps for electrically connecting the first electrode pads, and forming a heat conducting layer on the first non-active surface of the first semiconductor chip; disposing an electronic element on the first semiconductor chip and electrically connecting the electronic element and the first bumps; and forming an encapsulant on the first surface of the carrier for encapsulating the first semiconductor chip and the electronic element.

The present invention provides another fabrication method of a semiconductor package, which comprises the steps of: providing a carrier having a first surface with a plurality of conductive elements and a second surface opposite to the first surface; disposing a first semiconductor chip on the first surface of the carrier in a flip-chip manner, wherein the first semiconductor chip has a first active surface and a first non-active surface opposite to the first active surface, and the first active surface has a plurality of first electrode pads electrically connected to the conductive elements, respectively; thinning the first semiconductor chip from the first non-active surface thereof; forming a plurality of first through holes in the first semiconductor chip via the first non-active surface; forming in the first through holes a plurality of first bumps electrically connecting the first electrode pads; disposing an electronic element on the first semiconductor chip and electrically connecting the electronic element and the first bumps; and forming an encapsulant on the first surface of the carrier for encapsulating the first semiconductor chip and the electronic element.

The present invention provides another fabrication method of a semiconductor package, which comprises the steps of: providing a carrier having opposite first and second surfaces, wherein a build-up structure is formed on the first surface of the carrier and has a plurality of conductive pads exposed from the a top surface thereof; disposing a first semiconductor chip on the build-up structure in a flip-chip manner, wherein the first semiconductor chip has a first active surface and a first non-active surface opposite to the first active surface, and the first active surface has a plurality of first electrode pads electrically connected to the conductive pads, respectively, and a plurality of first bumps are formed in the first semiconductor chip for electrically connecting to the first electrode pads; thinning the first semiconductor chip from the first non-active surface thereof so as to expose the first bumps; disposing an electronic element on the first semiconductor chip and electrically connecting the electronic element and the first bumps; and forming an encapsulant on the build-up structure for encapsulating the first semiconductor chip and the electronic element.

Therefore, the present invention performs fabrication processes directly on a carrier and eliminates the need to debond the wafer as in the prior art so as to improve the product yield. The product yield is further improved by allowing an electrical test to be performed to the carrier so as for good dies to be disposed on the carrier at positions where no electrical performance failure occurs. Furthermore, since the semiconductor chip is thinned after it is disposed on the carrier, the present invention overcomes the conventional difficulties in stacking or bonding steps. Moreover, the carrier can be removed to reduce the thickness of the overall package. In addition, a heat conducting layer and a heat sink can be provided to improve the heat dissipating efficiency.

BRIEF DESCRIPTION OF DRAWINGS

FIGS. 2-1 to 2-3 are schematic cross-sectional views showing a semiconductor package and a fabrication method thereof according to a second embodiment of the present invention;

FIGS. 3-1 to 3-10 are schematic cross-sectional views showing a semiconductor package and a fabrication method thereof according to a third embodiment of the present invention;

FIG. 4 is a schematic cross-sectional view showing a semiconductor package according to a fourth embodiment of the present invention, wherein FIG. 4' shows another embodiment of FIG. 4;

FIGS. 5-1 to 5-5 are schematic cross-sectional views showing a semiconductor package and a fabrication method thereof according to a fifth embodiment of the present invention;

FIGS. 6-1 to 6-6 are schematic cross-views showing a semiconductor package and a fabrication method thereof according to a sixth embodiment of the present invention, wherein FIG. 6-6' shows another embodiment of FIG. 6-6; and FIGS. 7-1 to 7-5 and FIGS. 8-1 to 8-3 are schematic cross-sectional views showing a semiconductor package and a fabrication method thereof according to a seventh embodiment of the present invention, wherein FIGS. 8-1 to 8-3 show another embodiment of FIGS. 7-4 and 7-5.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "top", "bottom", "on", "one" etc. are merely for illustrative purpose and should not be construed to limit the scope of the present invention.

First Embodiment

FIGS. 1-1 to 1-33 are schematic cross-sectional views showing a semiconductor package and a fabrication method thereof according to a first embodiment of the present invention.

Figure 1:
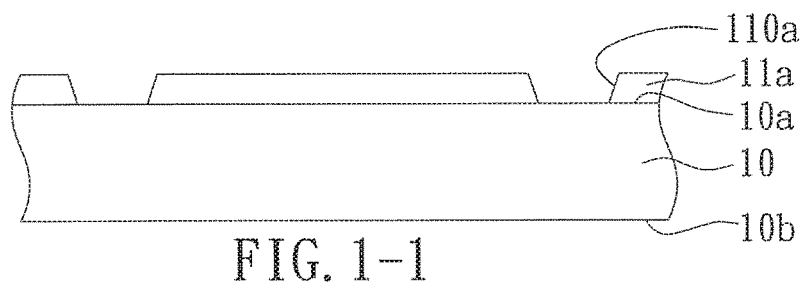
FIGS. 1-1 to 1-33 are schematic cross-sectional views showing a semiconductor package and a fabrication method thereof according to a first embodiment of the present invention, wherein FIGS. 1-7' and 1-8' show another embodiment of FIGS. 1-7 to 1-12, FIGS. 1-12' to 1-17' show another embodiment of FIGS. 1-12 to 1-17, FIGS. 1-21' and 1-22' show another embodiment of FIGS. 1-21 to 1-25, and FIG. 1-32' shows another embodiment of FIG. 1-32.

Referring to FIG. 1-1, a carrier 10 having a first surface 10a and a second surface 10b opposite to the first surface 10a is provided. A first dielectric layer 11a is formed on the first surface 10a and a plurality of openings 110a are formed in the first dielectric layer 11a for exposing a portion of the first surface 10a. The carrier 10 can be, but not limited to, a silicon wafer, an aluminum coated wafer or a glass sheet. If the surfaces of the carrier 10 such as an aluminum-coated wafer are conductive, an electrical test can be performed to determine the yield of circuits on the carrier 10. The first dielectric layer 11a can be made of benzocylcobuthene (BCB), polyimide, polybenzoxazole (PBO), $SiO_2$ or $Si_3N_4$.

Figures 1, 2:
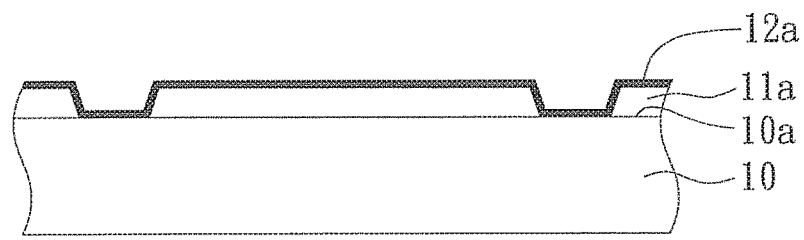

Referring to FIG. 1-2, a first conductive layer 12a is formed on the first surface 10a and the first dielectric layer 11a by sputtering.

Figures 1, 2, 3:
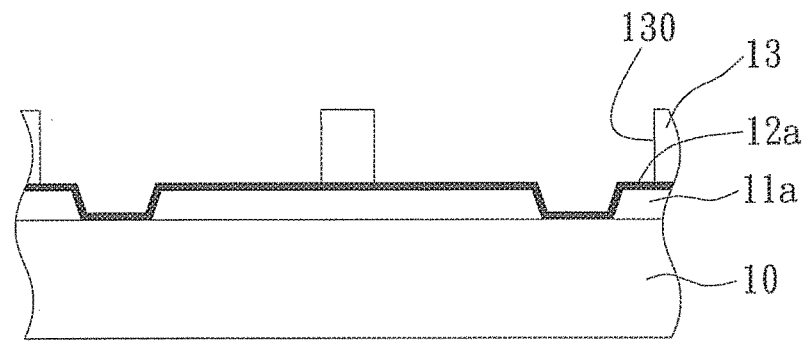

Referring to FIG. 1-3, a first resist layer 13 is formed on the first conductive layer 12a and a plurality of openings 130 are formed in the first resist layer 13 for exposing a portion of the first conductive layer 12a.

Referring to FIG. 1-4, a first circuit layer 12b is formed on the exposed portion of the first conductive layer 12a. The first circuit layer 12b can be made of copper or aluminum.

Referring to FIG. 1-5, the first resist layer 13 and the portion of the first conductive layer 12a covered by the first resist layer 13 are removed such that the first dielectric layer 11a, and the remaining portion of the first conductive layer 12a and the first circuit layer 12b form a build-up structure. It should be noted that the build-up structure is not limited to the drawing.

Referring to FIG. 1-6, a second dielectric layer 11b is formed on the first dielectric layer 11a and the first circuit layer 12b, and a plurality of openings 110b are formed in the second dielectric layer 11b such that a portion of the first circuit layer 12b is exposed through the openings 110b to serve as conductive pads 131. The second dielectric layer 11b can be made of benzocylcobuthene (BCB), polyimide, polybenzoxazole (PBO), $SiO_2$ or $Si_3N_4$.

Referring to FIG. 1-7, a second conductive layer 14 is formed on the second dielectric layer 11b and the first circuit layer 12b by sputtering.

Referring to FIG. 1-8, a second resist layer 15 is formed on the second conductive layer 14 and a plurality of openings 150 are formed in the second resist layer 15 for exposing a portion of the second conductive layer 14.

Referring to FIG. 1-9, a first solder material 16 such as Sn—Ag is formed on the exposed portion of the second conductive layer 14.

Referring to FIG. 1-10, the second resist layer 15 and the portion of the second conductive layer 14 covered by the second resist layer 15 are removed.

Referring to FIG. 1-11, the first solder material 16 is reflowed.

Referring to FIG. 1-12, an electronic element such as a first semiconductor chip 17 is provided. The first semiconductor chip 17 has a first active surface 17a and a first non-active surface 17b opposite to the first active surface 17a. The first active surface 17a has a plurality of first electrode pads 171. A copper pillar 172 and a third solder material 173 are sequentially formed on each of the first electrode pads 171. Alternatively, referring to FIG. 1-12', only a third solder material 173 is formed on each of the first electrode pads 171 and no copper pillar 172 is formed between the third solder material 173 and the first electrode pad 171.

It should be noted that the steps of FIGS. 1-7 to 1-12 can be simplified as an ENEPIG (Electroless Nickel Electroless Palladium Immersion Gold) process or the like so as to facilitate subsequent solder bonding with the semiconductor chip. For example, referring to FIGS. 1-7' and 1-8', an ENEPIG layer 161 can be formed in the openings 110b of the second dielectric layer so as to dispense with the reflow process of FIG. 1-11. Further, the conductive pads 131 can be electrically connected to the first electrode pads 171 of the first semiconductor chip 17 through the ENEPIG layer 161. Alternatively, the step of FIG. 1-9 can be replaced with an ENEPIG process or the like so as to increase solder bonding area with the semiconductor chip and dispensed with the reflow process of FIG. 1-11. This can be readily understood by those skilled in the art upon reading the present disclosure and thus is not described further herein.

Referring to FIG. 1-13, the first semiconductor chip 17 is disposed on the first solder material 16 in a flip-chip manner and a first underfill 18a is formed between the first semiconductor chip 17 and the second dielectric layer 11b.

Referring to FIG. 1-14, a first encapsulant 19a is formed on the second dielectric layer 11b for encapsulating the first semiconductor chip 17 and the first underfill 18a.

Referring to FIG. 1-15, a grinding process is performed to remove a portion of the first encapsulant 19a from the first non-active surface 17b of the first semiconductor chip 17 and thin the first semiconductor chip 17.

Referring to FIG. 1-16, a third resist layer 20 is formed on the first semiconductor chip 17 and the first encapsulant 19a and a plurality of openings 200 are formed in the third resist layer 20 for exposing portions of the first non-active surface 17b corresponding in position to the first electrode pads 171.

Referring to FIG. 1-17, portions of the first semiconductor chip 17 under the openings 200 of the third resist layer 20 are removed to define a plurality of first through holes 170 that expose the first electrode pads 171, respectively. Further, the third resist layer 20 is removed. In another embodiment, referring to FIG. 1-17', a third circuit layer 174 electrically connected to the first electrode pads 171 is exposed through the first through holes 170.

Referring to FIG. 1-18, a first insulating layer 21 is formed on the first non-active surface 17b, the first encapsulant 19a and the first electrode pads 171. The first insulating layer 21 can be and made of $Si_3N_4$ or $SiO_2$ through a PECVD process.

Referring to FIG. 1-19, a fourth resist layer 22 is formed on the first insulating layer 21 and a plurality of openings 220 are formed in the fourth resist layer 22 to expose the first encapsulant 19a and portions of the first insulating layer 21 on the first electrode pads 171.

Referring to FIG. 1-20, the portions of the first insulating layer 21 not covered by the fourth resist layer 22 are removed by etching. Then, the fourth resist layer 22 is removed.

In the above-described steps of FIGS. 1-18 to 1-20, the first insulating layer 21 can be alternatively made of photosensitive benzocyclobuthene (BCB), polyimide or polybenzoxazole (PBO), which is coated, exposed and developed such that the fabrication cost is reduced and the first insulating layer 21 is elastic to absorb thermal expansion stresses in the first through holes 170 of the first semiconductor chip 17.

Referring to FIG. 1-21, a third conductive layer 23 is formed on the first insulating layer 21, the first encapsulant 19a and the first electrode pads 171 so as to serve as a barrier layer and an UBM (Under Bump Metallurgy) layer.

Referring to FIG. 1-22, a fifth resist layer 24 is formed on the third conductive layer 23 and a plurality of openings 240 are formed in the fifth resist layer 24 corresponding in position to the first through holes 170.

Referring to FIG. 1-23, a plurality of first bumps 25a are formed in the openings 240 of the fifth resist layer 24 through electroplating, ENEPIG or solder paste print. The first bumps 25a can be made of Ni, Sn, Ag, Cu, Pd, Au, Al or a combination thereof.

Referring to FIG. 1-24, the fifth resist layer 24 and the portion of the third conductive layer 23 covered by the fifth resist layer 24 are removed and the first bumps 25a are reflowed.

Referring to FIG. 1-25, an electronic element such as a second semiconductor chip 26 is provided, which has a second active surface 26a with a plurality of second electrode pads 261 and a second non-active surface 26b opposite to the second active surface 26a. A copper pillar 262 and a third solder material 263 are sequentially formed on each of the second electrode pads 261.

It should be noted that the steps of FIGS. 1-21 to 1-25 can be simplified as the ENEPIG process or the like so as to facilitate subsequent solder bonding with the semiconductor chip. For example, referring to FIGS. 1-21' and 1-22', an ENEPIG layer 175 can be formed on the first electrode pads 171 so as to dispense with the reflow process of FIG. 1-24. Further, the first electrode pads 171 can be electrically connected to the second electrode pads 261 of the second semiconductor chip 26 through the ENEPIG layer 175. Alternatively, the step of FIG. 1-23 can be replaced with an ENEPIG process or the like so as to increase solder bonding area with the semiconductor chip and dispense with the reflow process of FIG. 1-24. This can be readily understood by those skilled in the art upon reading the present disclosure and thus is not described further herein.

Referring to FIG. 1-26, the second semiconductor chip 26 is disposed on the first bumps 25a of the first semiconductor chip 17 in a flip-chip manner and the steps of FIGS. 1-13 to 1-24 are repeated, thereby forming a second underfill 18b, a second encapsulant 19b, a plurality of second bumps 25b and so on.

Referring to FIG. 1-27, an electronic element such as a third semiconductor chip 27 is provided, which has a third active surface 27a with a plurality of third electrode pads 271 and a third non-active surface 27b opposite to the third active surface 27a. A copper pillar 272 and a third solder material 273 are sequentially formed on each of the third electrode pads 271. It should be noted that in other embodiments, the electronic element can be a passive element or a semiconductor package.

Referring to FIG. 1-28, the third semiconductor chip 27 is disposed on the second bumps 25b of the second semiconductor chip 26 in a flip-chip manner and the processes of FIGS. 1-13 to 1-14 are repeated so as to form a third underfill 18c, a third encapsulant 19c and so on.

Referring to FIG. 1-29, a portion of the third encapsulant 19c is removed from the third non-active surface of the third semiconductor chip 27 by grinding. In other embodiments, the third non-active surface 27b of the third semiconductor chip 27 is exposed by grinding so as to increase the heat dissipating efficiency.

Referring to FIG. 1-30, a portion of the carrier 10 is removed by grinding. If the carrier 10 is a silicon wafer, it can be removed by dry etching or chemical mechanical polishing (CMP).

Referring to FIG. 1-31, the carrier 10 is completely removed by dry etching or chemical mechanical polishing (CMP) such that portions of the first conductive layer 12a are exposed to serve as bonding pads 121.

Referring to FIG. 1-32, a plurality of solder balls 28 are mounted on the bonding pads 121, respectively. Alternatively, referring to FIG. 1-32', a build-up structure is formed on the bonding pads 121 and solder balls 28 are further mounted on the build-up structure. This can be readily understood by those skilled in the art upon reading the present disclosure and thus is not described further herein.

Referring to FIG. 1-33, a singulation process is performed.

It should be noted that after the steps of FIG. 1-11, 1-13, 1-14, 1-15, 1-24 or 1-26, the carrier 10 can be thinned or an insulating material made of such as benzocyclobuthene (BCB), polyimide, polybenzoxazole (PBO), $SiO_2$, $Si_3N_4$ can be coated on the carrier 10 so as to adjust surface stresses of the carrier 10, thus avoiding warpage of the overall structure.

Second Embodiment

FIGS. 2-1 to 2-3 are schematic cross-sectional views showing a semiconductor package and a fabrication method thereof according to a second embodiment of the present invention.

Referring to FIG. 2-1, continued from FIG. 1-21, a fifth resist layer 24 is formed on the third conductive layer 23 and a plurality of openings 240 are formed in the fifth resist layer 24 corresponding in position to the first through holes 170 and a portion of the first non-active surface 17b. Further, a plurality of first bumps 25a and a second circuit layer 29 electrically connected to the first bumps 25a are formed in the openings 240 of the fifth resist layer 24.

Referring to FIG. 2-2, the fifth resist layer 24 and the portion of the third conductive layer 23 covered by the fifth resist layer 24 are removed.

Referring to FIG. 2-3, a third dielectric layer 30 is formed on the first insulating layer 21, the first encapsulant 19a and the second circuit layer 29, and a plurality of openings 300 are formed in the third dielectric layer 30 for exposing a portion of the second circuit layer 29. Further, an UBM (under bump metallurgy) layer and a second solder material 31 are sequentially formed in the openings 300 of the third dielectric layer 30. Then, semiconductor chips, passive components or semiconductor packages can be stacked on the structure as in the first embodiment.

Third Embodiment

FIGS. 3-1 to 3-10 are schematic cross-sectional views showing a semiconductor package and a fabrication method thereof according to a third embodiment of the present invention.

Referring to FIG. 3-1, continued from FIG. 1-21, a fifth resist layer 24 is formed on the third conductive layer 23 and a plurality of openings 240 are formed in the fifth resist layer 24 to expose the first through holes 170, portions of the first non-active surface 17b and portions of the first encapsulant 19a.

Referring to FIG. 3-2, a plurality of first bumps 25a and a heat conducting layer 32 made of such as copper are formed in the openings 240 of the fifth resist layer 24, respectively. The first bumps 25a are located in the first through holes 170 and the heat conducting layer 32 is located on the exposed portions of the first non-active surface 17b and the first encapsulant 19a.

Referring to FIG. 3-3, the fifth resist layer 24 is removed.

Figures 1, 2, 3, 4:
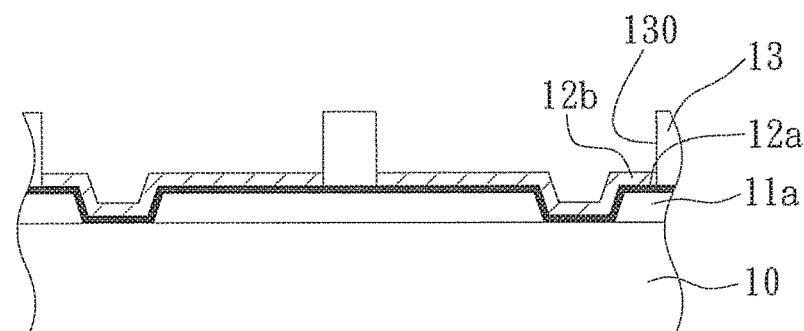

Referring to FIG. 3-4, a sixth resist layer 33 is formed to cover the heat conducting layer 32 and the first bumps 25a are exposed through a plurality of openings 330 in the sixth resist layer 33.

Figures 1, 2, 3, 4, 5:
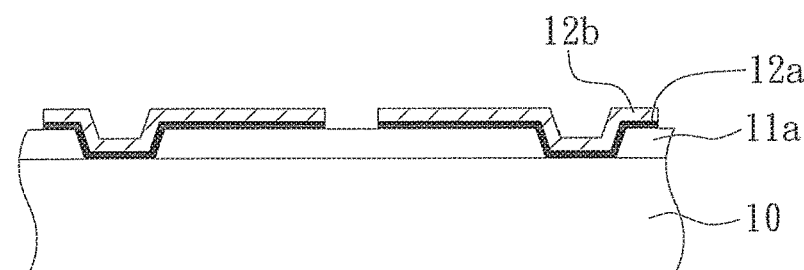

Referring to FIG. 3-5, a plurality of third bumps 34 and a second solder material 31 are sequentially formed in the openings 330 of the sixth resist layer 33. The third bumps 34 are made of copper or nickel. The second solder material 31 is made of Sn—Ag.

Referring to FIG. 3-6, the sixth resist layer 33 and the portions of the third conductive layer 23 covered by the sixth resist layer 33 are removed.

Referring to FIG. 3-7, a third dielectric layer 30 is formed on the first insulating layer 21, the first encapsulant 19a and the heat conducting layer 32, and a plurality openings 300 are formed in the third dielectric layer 30 for exposing the third bumps 34, the second solder material 31 and portions of the first encapsulant 19a.

Referring to FIG. 3-8, a reflow process is performed.

Referring to FIG. 3-9, a second semiconductor chip 26 is provided, which has a second active surface 26a with a plurality of second electrode pads 261 and a second non-active surface 26b opposite to the second active surface 26a.

Referring to FIG. 3-10, the second semiconductor chip 26 is disposed on the third bumps 34 in a flip-chip manner and further encapsulated and singulated as the first embodiment so as to form a second underfill 18b, a second encapsulant 19b, a plurality of solder balls 28 and so on. Therein, the heat conducting layer 32 is exposed from the package. Furthermore, the second underfill 18b is filled in the openings 300 of the third dielectric layer so as to increase the contact area between the second underfill 18b and the first encapsulant 19a, thereby avoiding delamination of the second underfill 18b.

Fourth Embodiment

FIG. 4 is a schematic cross-sectional view showing a semiconductor package according to a fourth embodiment of the present invention.

The present embodiment is similar to the third embodiment. A main difference therebetween is a thermal adhesive 35 and a U-shaped heat sink 36 are disposed outside the first encapsulant 19a, the second encapsulant 19b and the second non-active surface 26b.

The heat sink 36 is connected to the heat conducting layer 32 through the thermal adhesive 35. Further, referring to FIG. 4', a portion of the third bumps 34 is grounded so as to be connected to the heat conducting layer 32.

Fifth Embodiment

FIGS. 5-1 to 5-5 are schematic cross-sectional views showing a semiconductor package and a fabrication method thereof according to a fifth embodiment of the present invention.

The present embodiment is similar to the above-described embodiments. A main difference therebetween is the carrier of the fifth embodiment is a circuit board or a packaging substrate having circuits embedded therein or on surfaces thereof and the carrier remains in the final structure.

Referring to FIG. 5-1, a carrier 10 and a first semiconductor chip 17 are provided. The carrier 10 is a circuit board or a packaging substrate having circuits embedded therein or on surfaces thereof.

Referring to FIG. 5-2, a first semiconductor chip 17 is disposed on the carrier 10 in a flip-chip manner. A first underfill 18a is formed between the first semiconductor chip 17 and the carrier 10. A first encapsulant 19a is formed on the carrier 10 to encapsulate the first semiconductor chip 17 and the first underfill 18a, and a portion of the first encapsulant 19a is removed from the non-active surface of the first semiconductor chip 17 by grinding.

Referring to FIG. 5-3, a heat conducting layer 32 and a plurality of third bumps 34 are formed on the first semiconductor chip 17 and the first encapsulant 19a.

Referring to FIG. 5-4, a second semiconductor chip 26 is disposed on the third bumps 34 in a flip-chip manner, and a second underfill 18b and a second encapsulant 19b are formed.

Referring to FIG. 5-5, a portion of the second encapsulant 19b is removed by grinding, a plurality of solder balls 28 are mounted on the carrier 10 and a singulation process is performed.

Sixth Embodiment

Figures 1, 2, 3, 4, 5, 6:
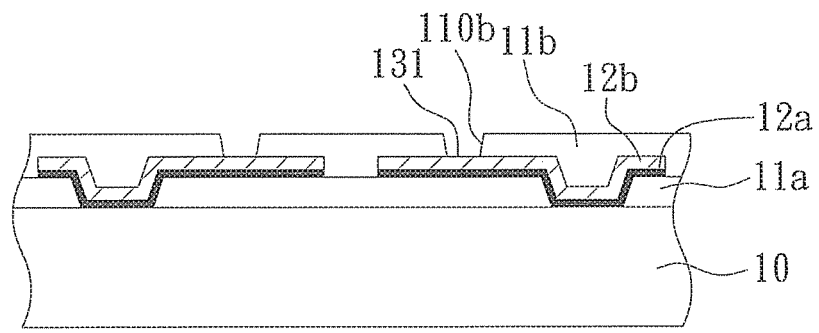

FIGS. 6-1 to 6-6 are schematic cross-sectional views showing a semiconductor package and a fabrication method thereof according to a sixth embodiment of the present invention. Therein, FIG. 6-6' shows another embodiment of FIG. 6-6.

The present embodiment is similar to the first embodiment. A main difference of the sixth embodiment from the first embodiment is that a first conductive layer 12a and conductive elements such as a first solder material 16 or an ENEPIG layer are directly formed on the carrier 10. Then, the steps of FIGS. 1-12 to 1-31 are performed and a plurality of solder balls 28 are further mounted on the exposed portion of the first conductive layer 12a so as to form a structure of FIG. 6-6. Alternatively, referring to FIG. 6-6', a build-up structure is formed on the exposed portions of the first conductive layer 12a and then a plurality of solder balls 28 are mounted on the build-up structure so as to form a structure of FIG. 6-6'.

Seventh Embodiment

Figures 1, 2, 3, 4, 5, 6, 7:
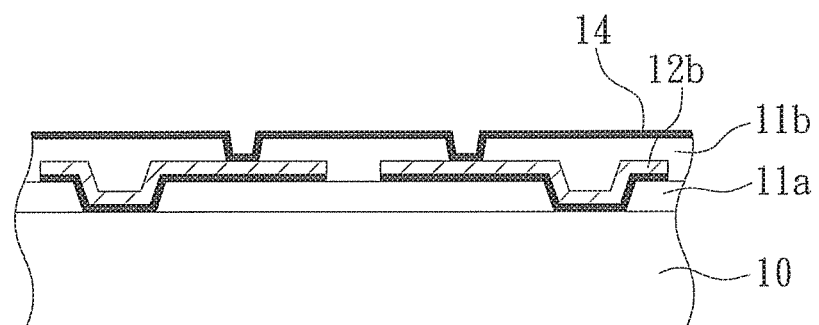

FIGS. 7-1 to 7-5 are schematic cross-sectional views showing a semiconductor package and a fabrication method thereof according to a seventh embodiment of the present invention.

The present embodiment is continued from FIG. 1-11 and similar to the first embodiment. A main difference of the seventh embodiment from the first embodiment is the first semiconductor chip 17 has a plurality of first bumps 25a. The first bumps 25a can be made of copper. In subsequent processes, the first semiconductor chip 17 can be thinned from the first non-active surface 17b thereof so as to expose the first bumps 25a. Further, a fourth dielectric layer 37 is formed on the first non-active surface 17b and the first encapsulant 19a and a plurality of openings are formed in the fourth dielectric layer 37 such that the first bumps 25a are exposed through the openings so as to be electrically connected to a semiconductor chip.

Figures 1, 2, 3, 4, 5, 6, 7, 8:
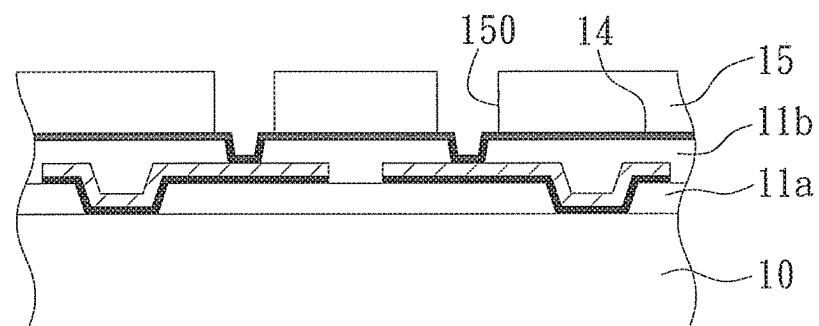
Figures 1, 2, 3, 4, 5, 6, 7, 8, 9:
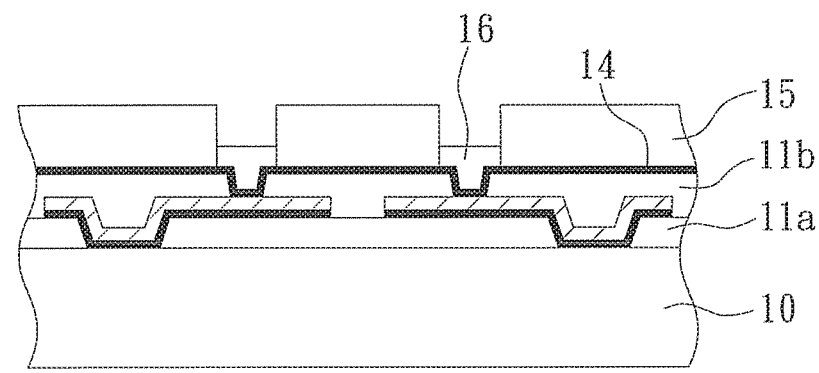
Figures 1, 2, 3, 4, 5, 6, 7, 8, 9, 10:
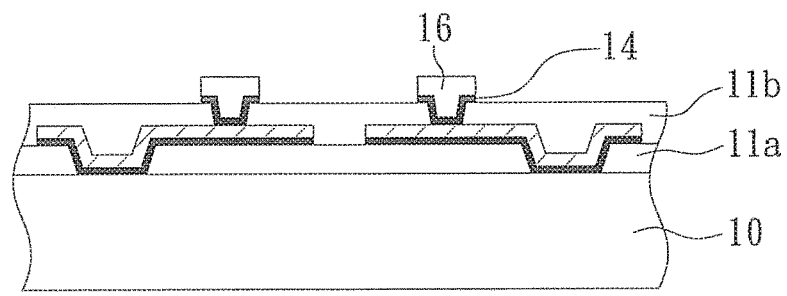
Figures 1, 2, 3, 4, 5, 6, 7, 8, 9, 10, 11:
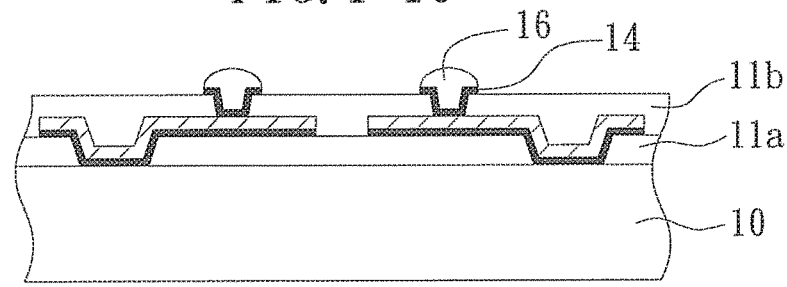
Figures 1, 2, 3, 4, 5, 6, 7, 8, 9, 10, 11, 12:
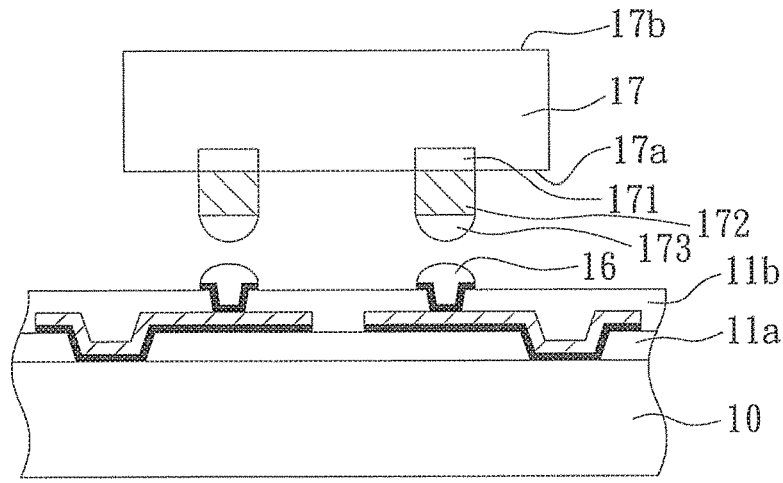
Figures 1, 2, 3, 4, 5, 6, 7, 8, 9, 10, 11, 12:
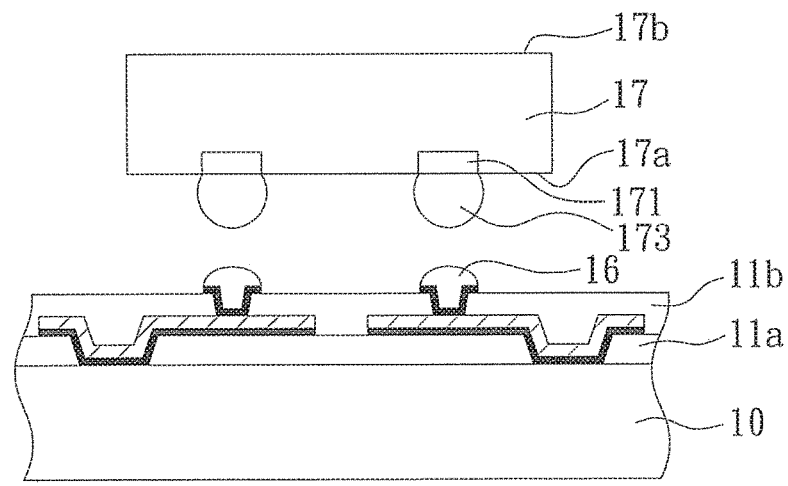
Figures 1, 2, 3, 4, 5, 6, 7:
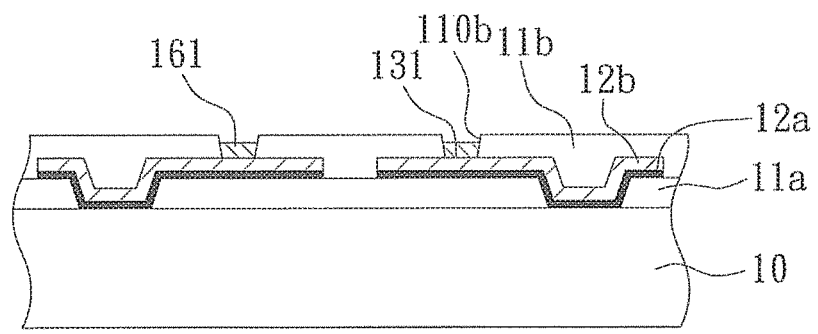
Figures 1, 2, 3, 4, 5, 6, 7, 8:
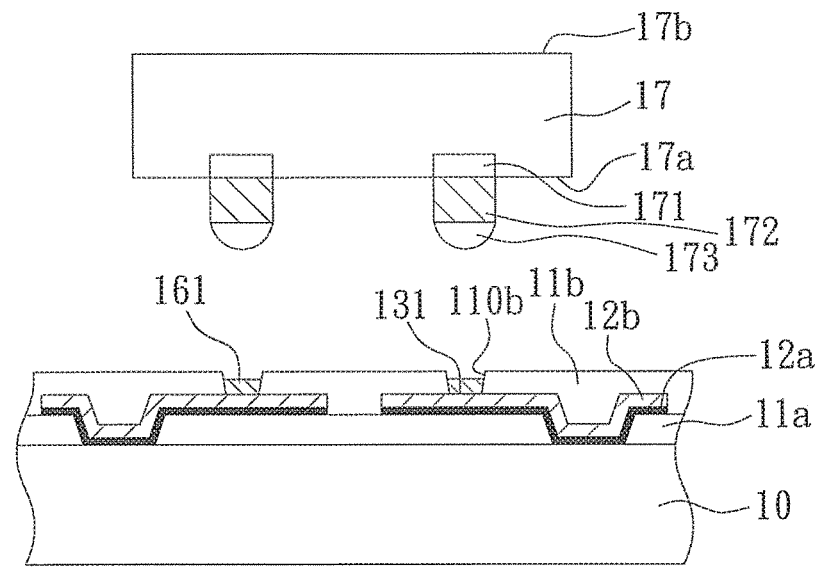
Figures 1, 2, 3, 4, 5, 6, 7, 8, 9, 10, 11, 12, 13:
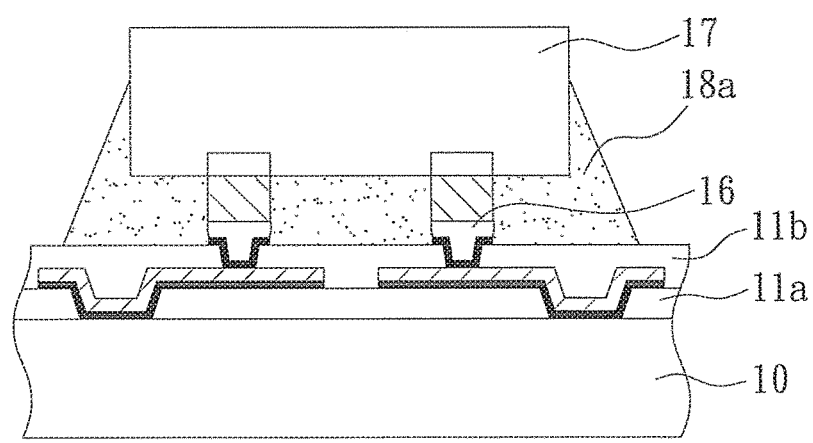
Figures 1, 2, 3, 4, 5, 6, 7, 8, 9, 10, 11, 12, 13, 14:
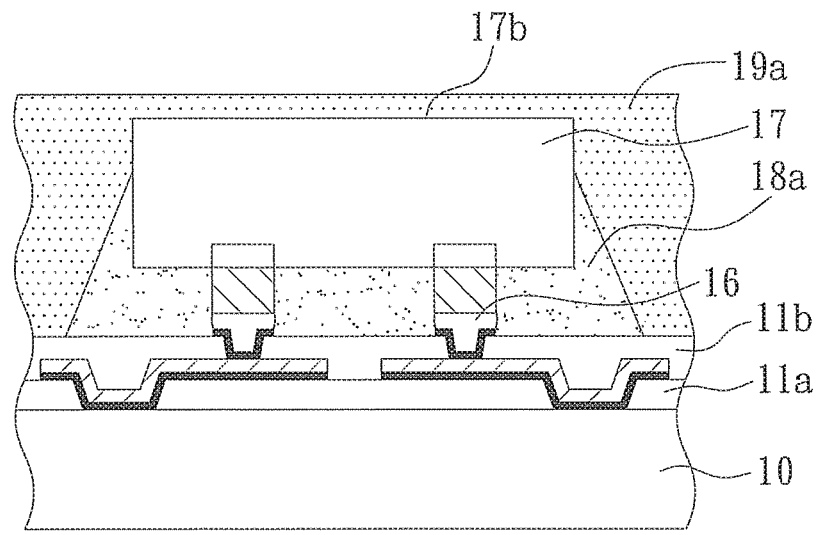
Figures 1, 2, 3, 4, 5, 6, 7, 8, 9, 10, 11, 12, 13, 14, 15:
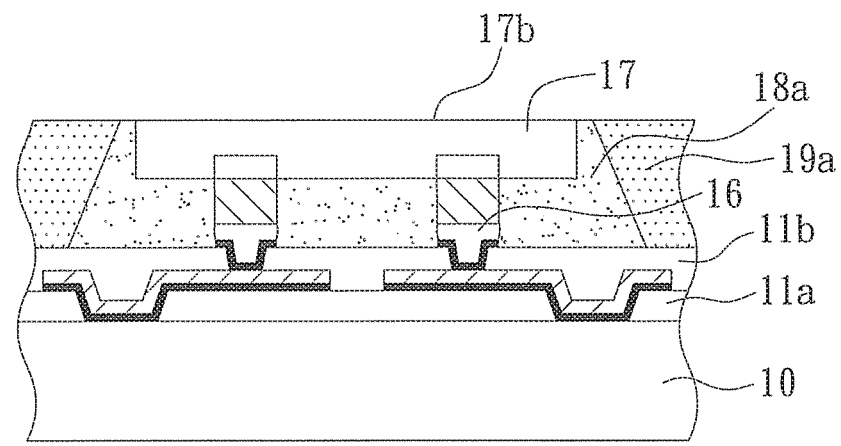
Figures 1, 2, 3, 4, 5, 6, 7, 8, 9, 10, 11, 12, 13, 14, 15, 16:
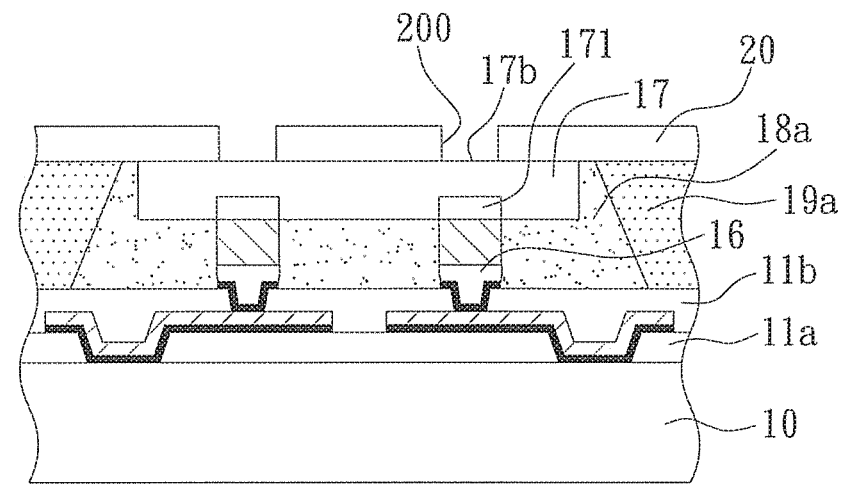
Figures 1, 2, 3, 4, 5, 6, 7, 8, 9, 10, 11, 12, 13, 14, 15, 16, 17:
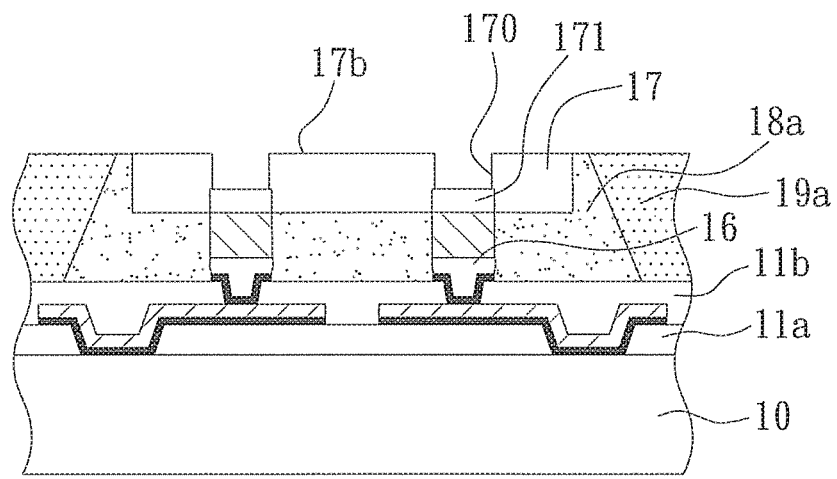
Figures 1, 2, 3, 4, 5, 6, 7, 8, 9, 10, 11, 12, 13, 14, 15, 16, 17:
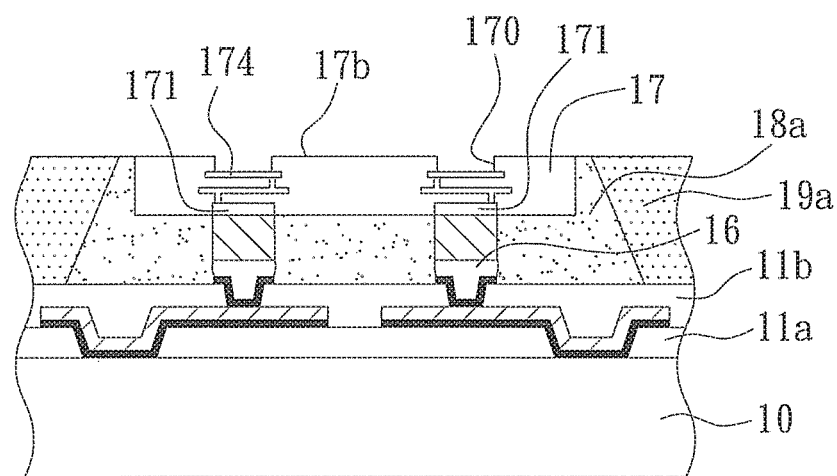
Figures 1, 2, 3, 4, 5, 6, 7, 8, 9, 10, 11, 12, 13, 14, 15, 16, 17, 18:
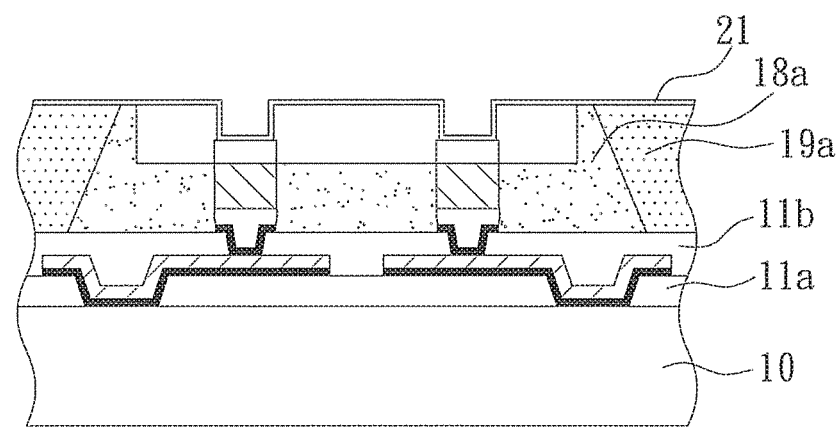
Figures 1, 2, 3, 4, 5, 6, 7, 8, 9, 10, 11, 12, 13, 14, 15, 16, 17, 18, 19:
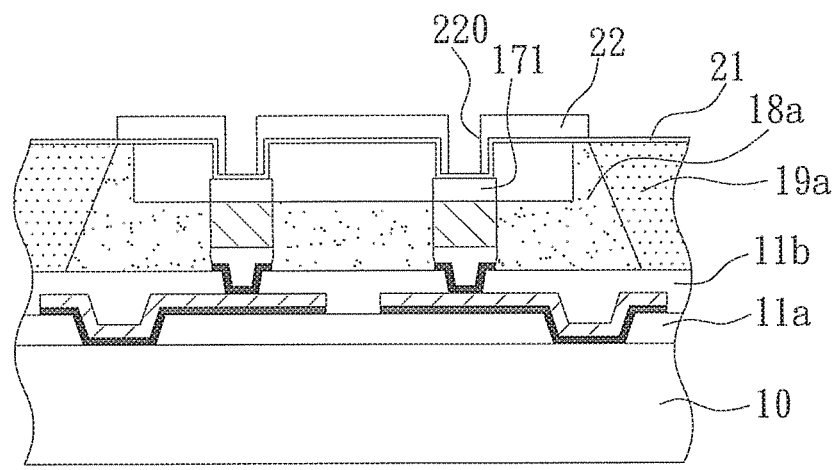
Figures 1, 2, 3, 4, 5, 6, 7, 8, 9, 10, 11, 12, 13, 14, 15, 16, 17, 18, 19, 20:
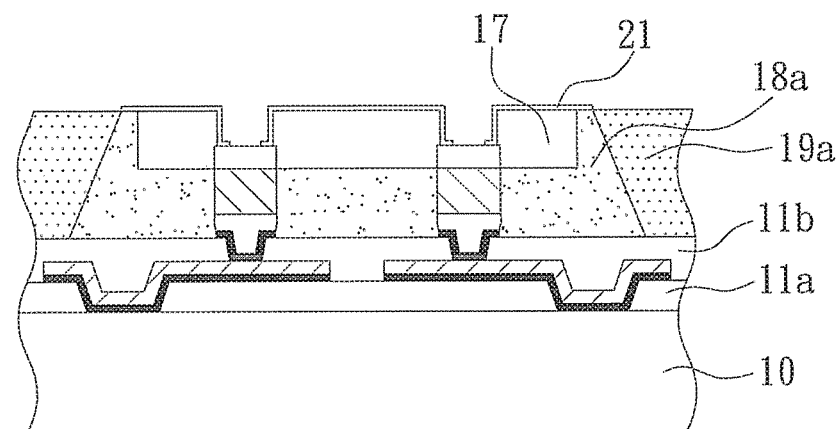
Figures 1, 2, 3, 4, 5, 6, 7, 8, 9, 10, 11, 12, 13, 14, 15, 16, 17, 18, 19, 20, 21:
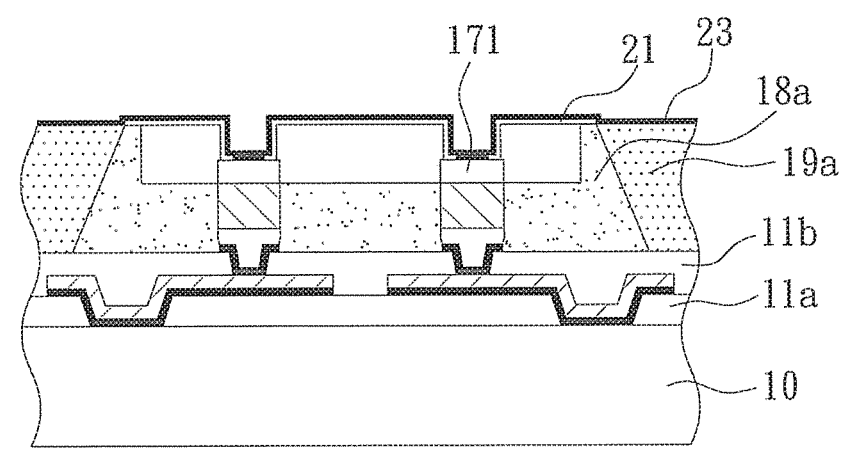
Figures 1, 2, 3, 4, 5, 6, 7, 8, 9, 10, 11, 12, 13, 14, 15, 16, 17, 18, 19, 20, 21, 22:
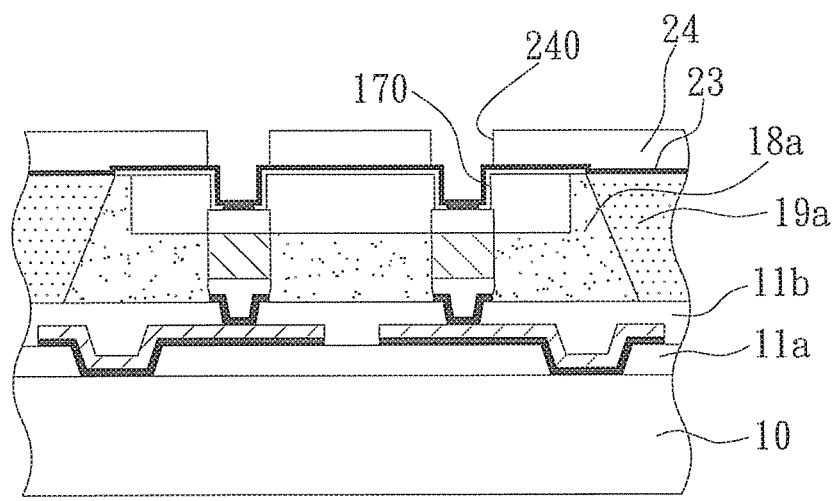
Figures 1, 2, 3, 4, 5, 6, 7, 8, 9, 10, 11, 12, 13, 14, 15, 16, 17, 18, 19, 20, 21, 22, 23:
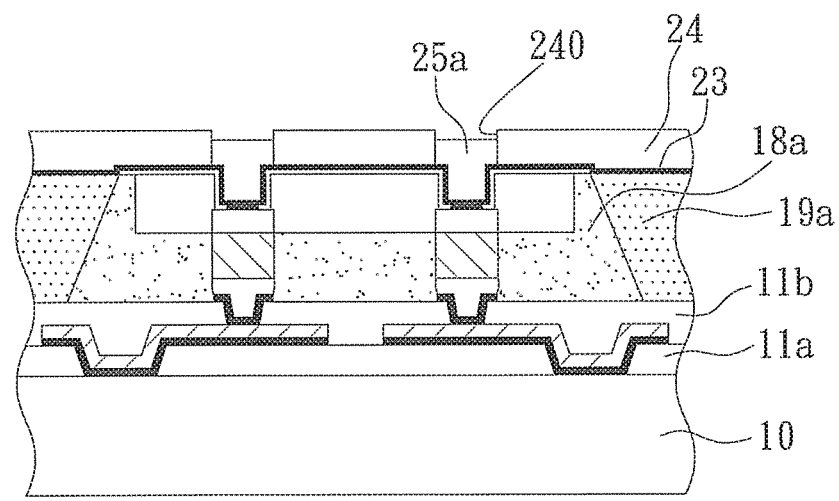
Figures 1, 2, 3, 4, 5, 6, 7, 8, 9, 10, 11, 12, 13, 14, 15, 16, 17, 18, 19, 20, 21, 22, 23, 24:
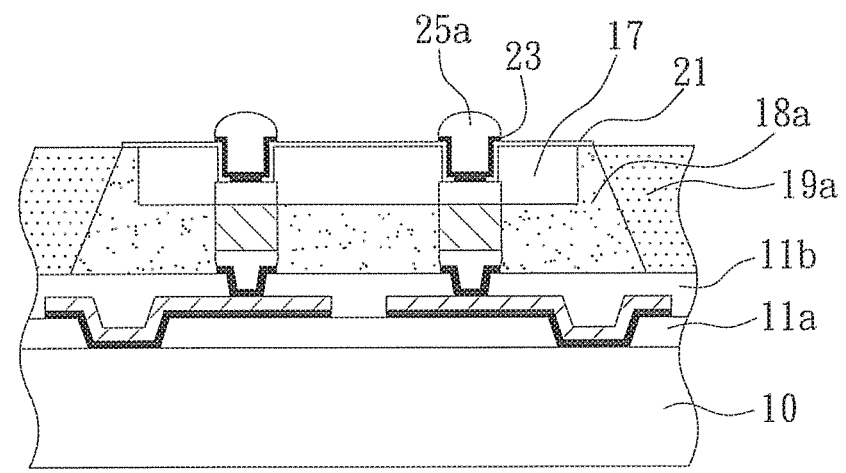
Figures 1, 2, 3, 4, 5, 6, 7, 8, 9, 10, 11, 12, 13, 14, 15, 16, 17, 18, 19, 20, 21, 22, 23, 24, 25:
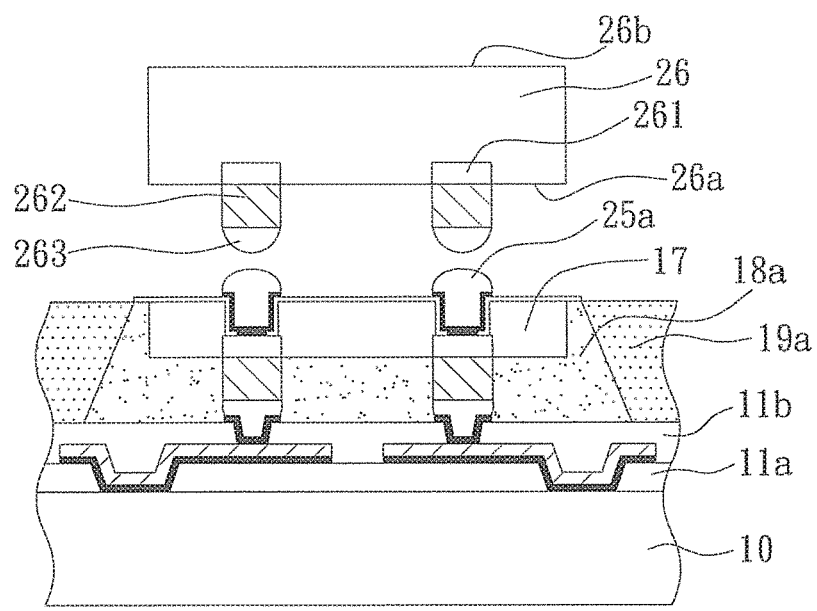
Figures 1, 2, 3, 4, 5, 6, 7, 8, 9, 10, 11, 12, 13, 14, 15, 16, 17, 18, 19, 20, 21:
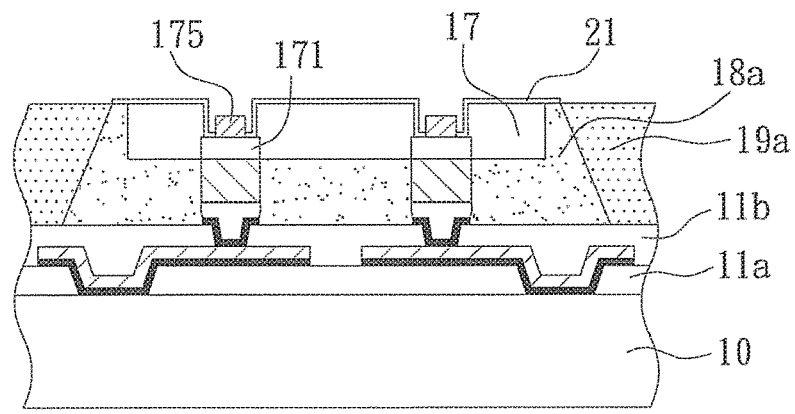
Figures 1, 2, 3, 4, 5, 6, 7, 8, 9, 10, 11, 12, 13, 14, 15, 16, 17, 18, 19, 20, 21, 22:
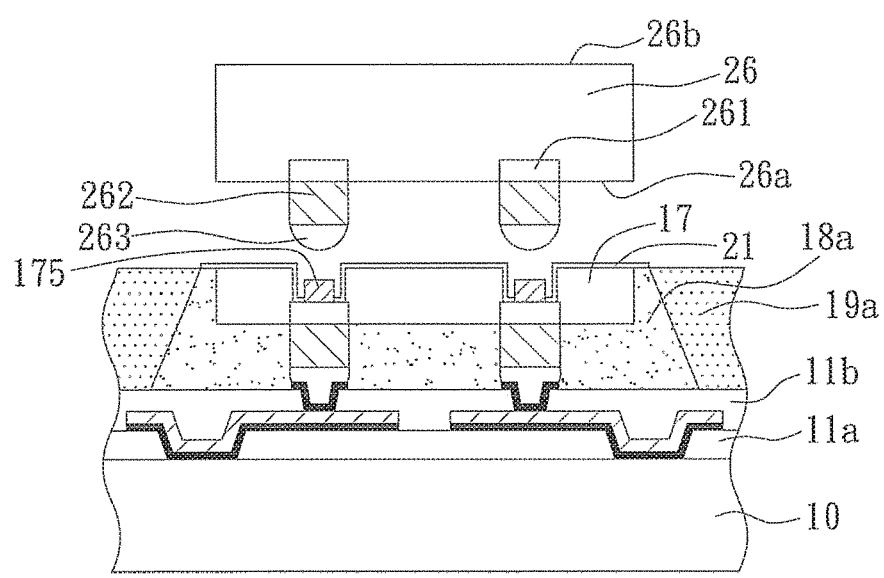
Figures 1, 2, 3, 4, 5, 6, 7, 8, 9, 10, 11, 12, 13, 14, 15, 16, 17, 18, 19, 20, 21, 22, 23, 24, 25, 26:
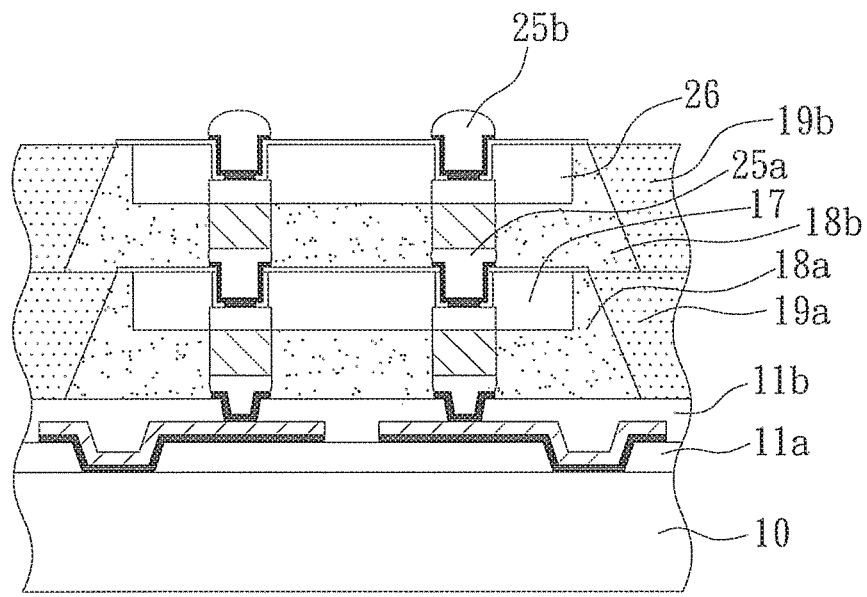
Figures 1, 2, 3, 4, 5, 6, 7, 8, 9, 10, 11, 12, 13, 14, 15, 16, 17, 18, 19, 20, 21, 22, 23, 24, 25, 26, 27:
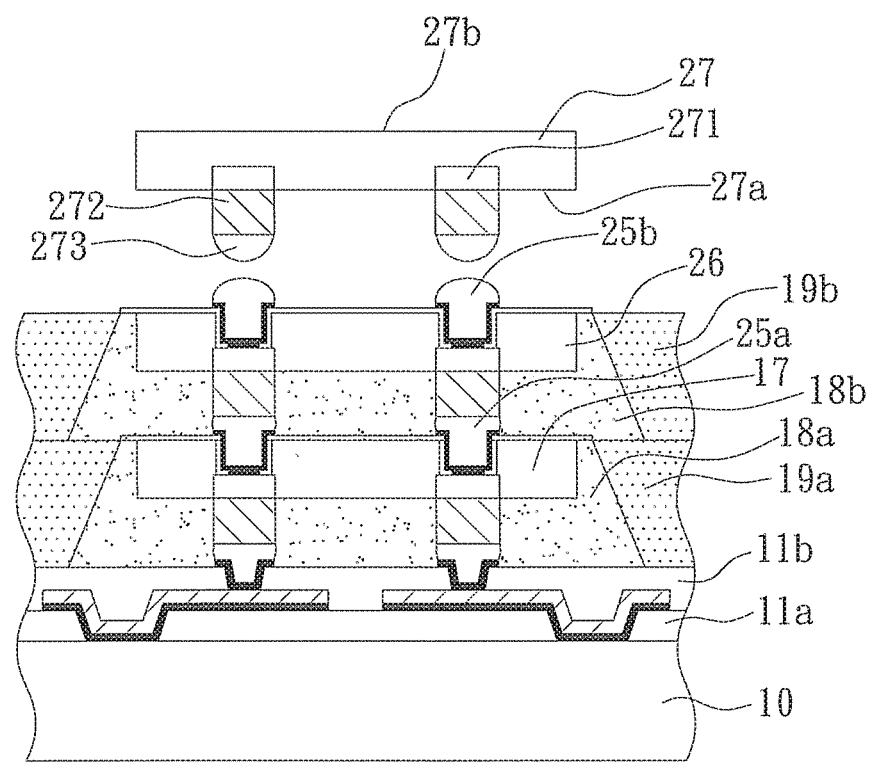
Figures 1, 2, 3, 4, 5, 6, 7, 8, 9, 10, 11, 12, 13, 14, 15, 16, 17, 18, 19, 20, 21, 22, 23, 24, 25, 26, 27, 28:
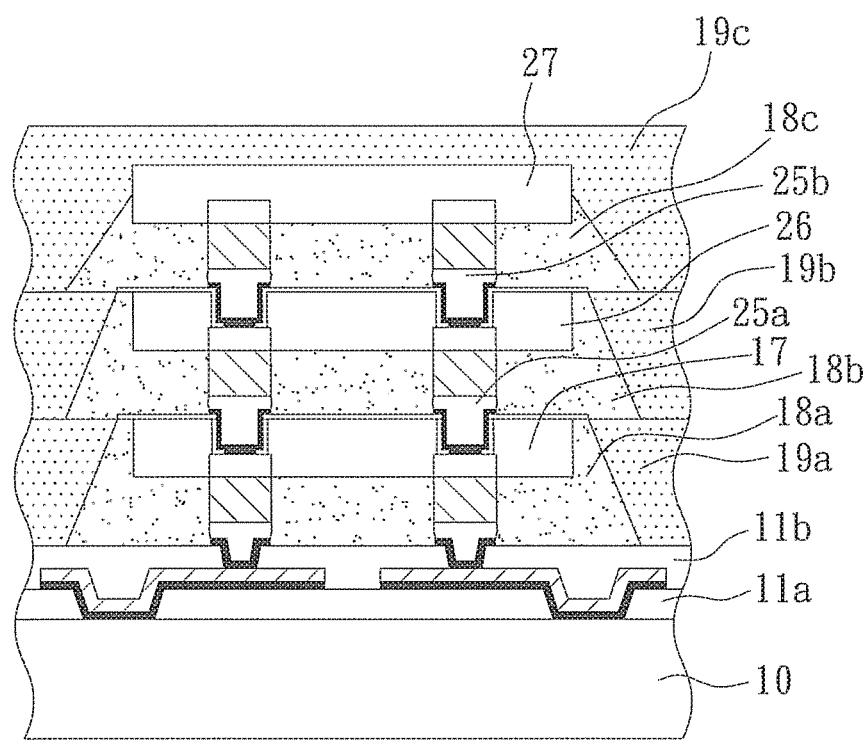
Figures 1, 2, 3, 4, 5, 6, 7, 8, 9, 10, 11, 12, 13, 14, 15, 16, 17, 18, 19, 20, 21, 22, 23, 24, 25, 26, 27, 28, 29:
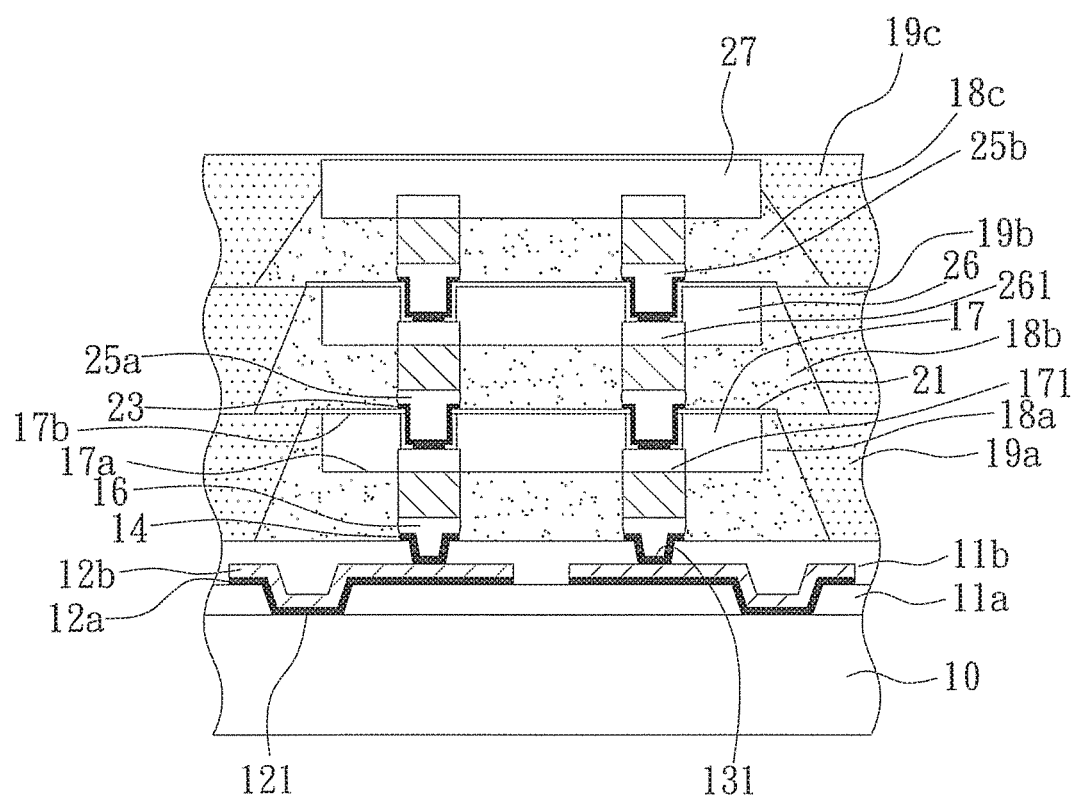
Figures 1, 2, 3, 4, 5, 6, 7, 8, 9, 10, 11, 12, 13, 14, 15, 16, 17, 18, 19, 20, 21, 22, 23, 24, 25, 26, 27, 28, 29, 30:
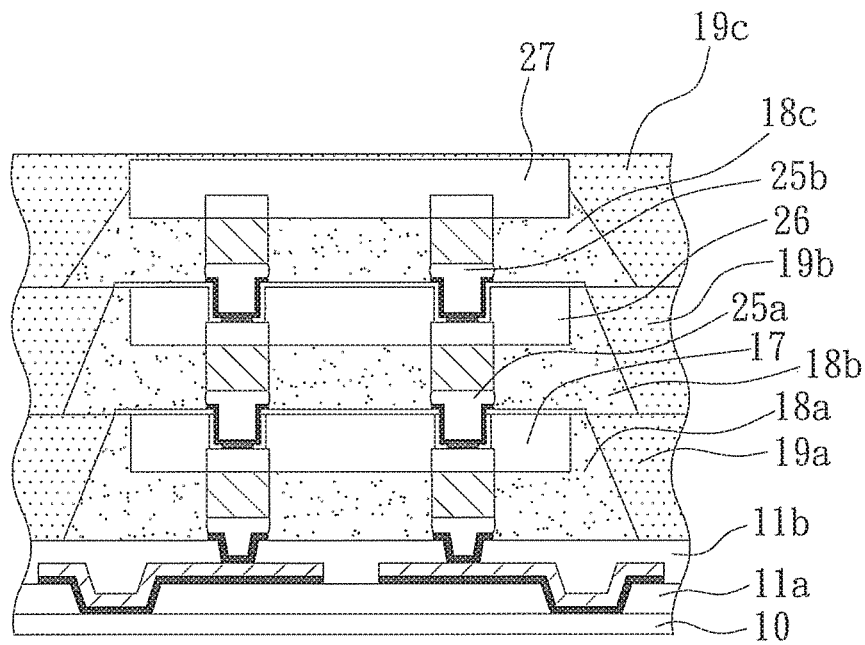
Figures 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31:
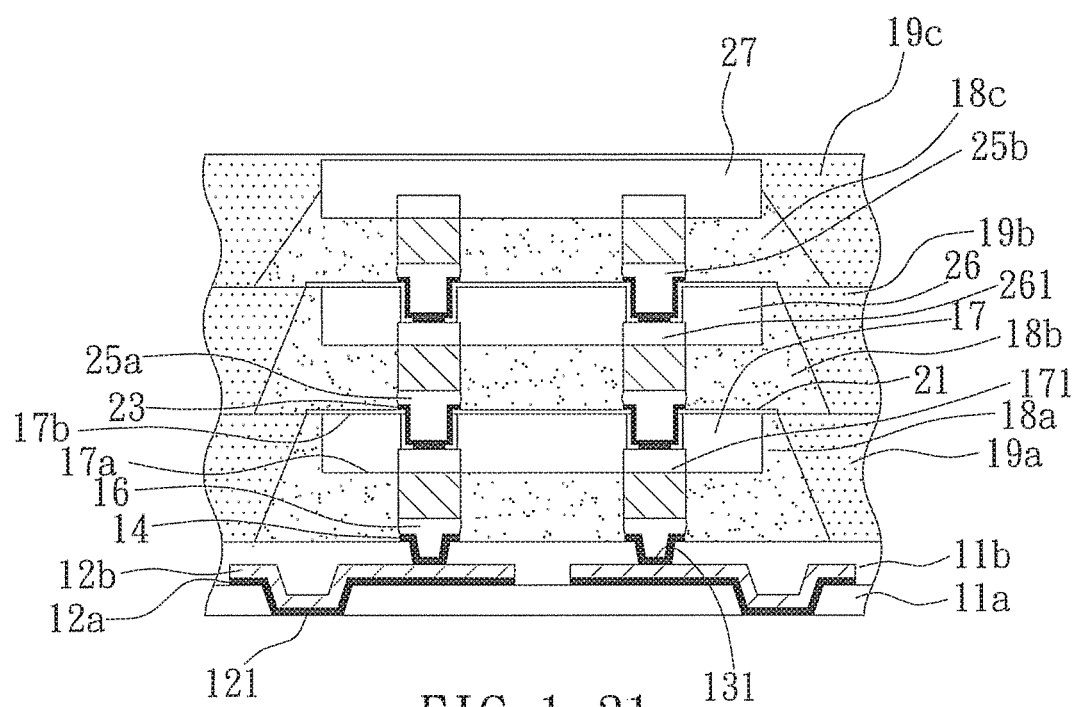
Figures 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32:
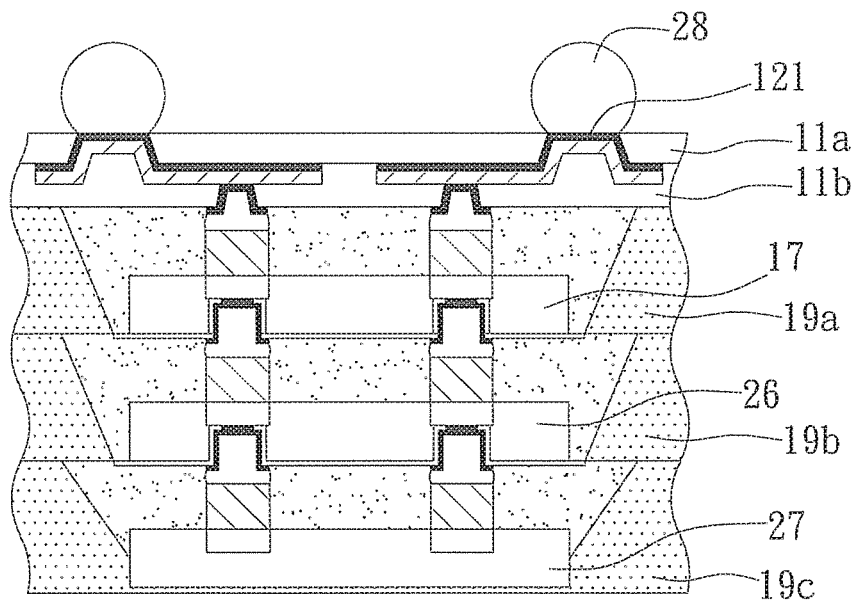
Figures 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32:
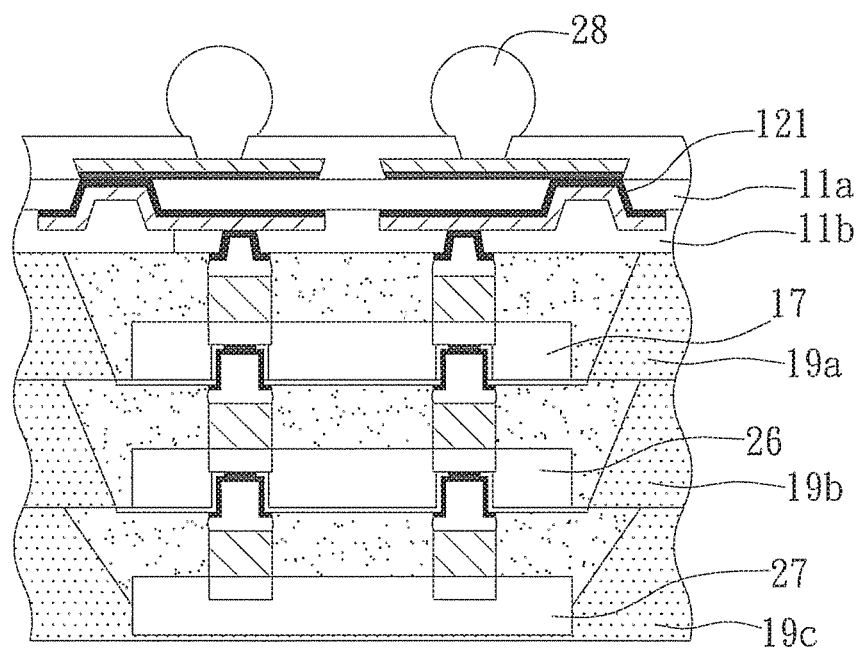
Figures 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33:
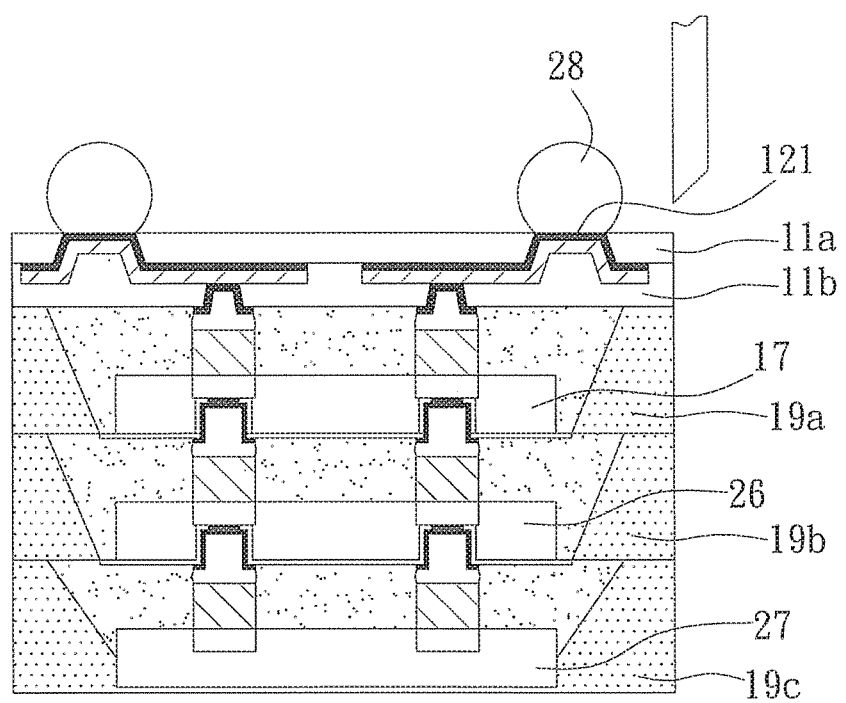
Figures 1, 2:
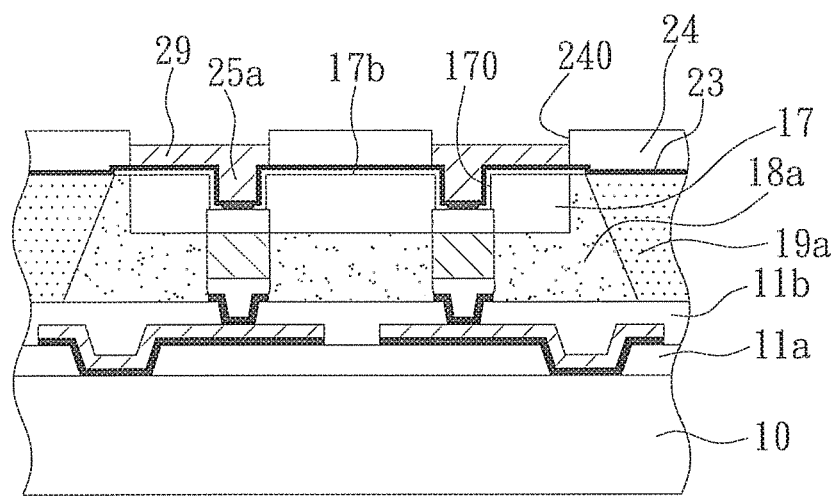
Figure 2:
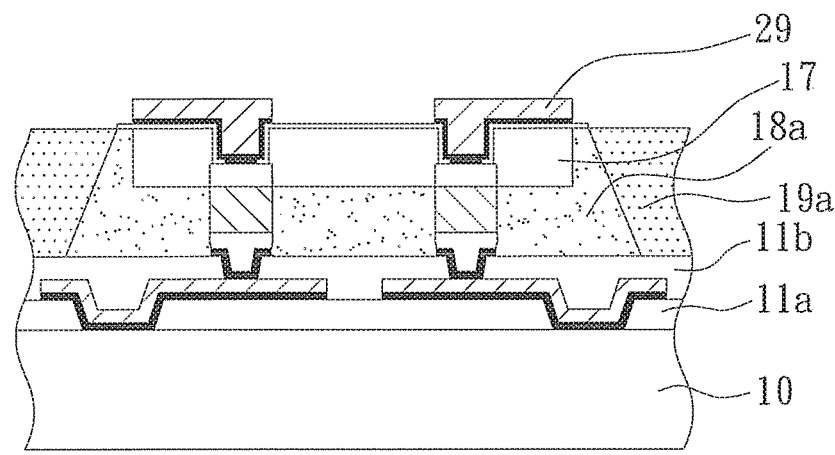
Figures 2, 3:
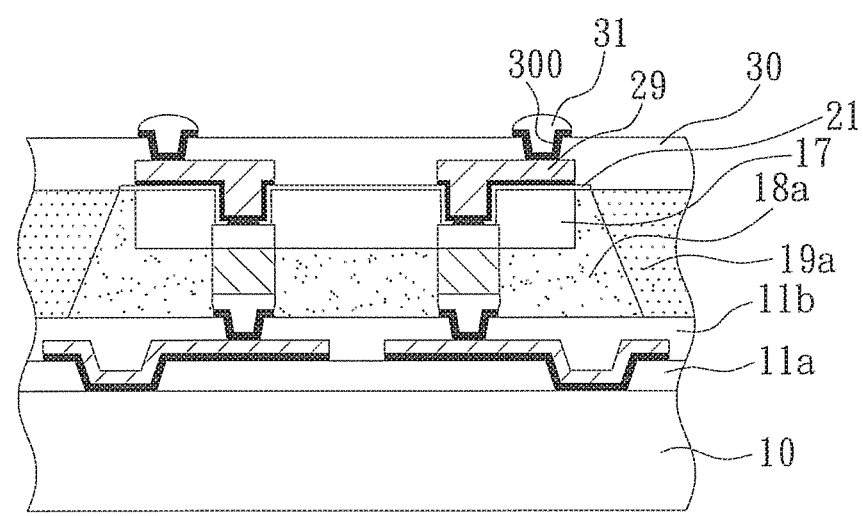
Figures 1, 3:
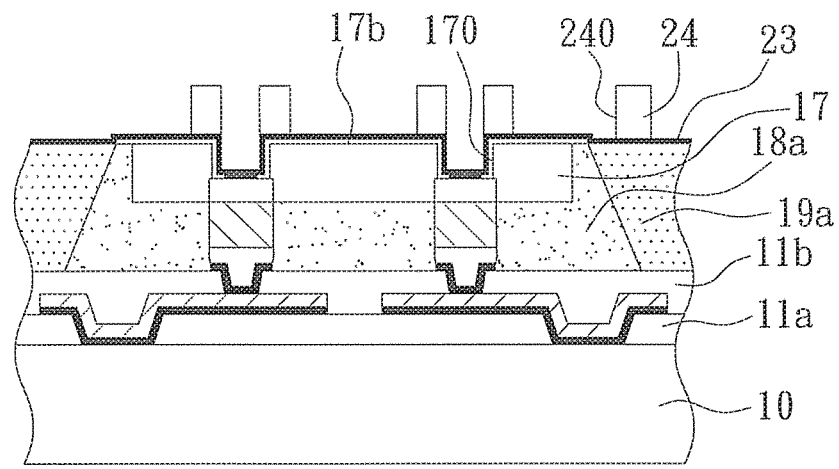
Figures 2, 3:
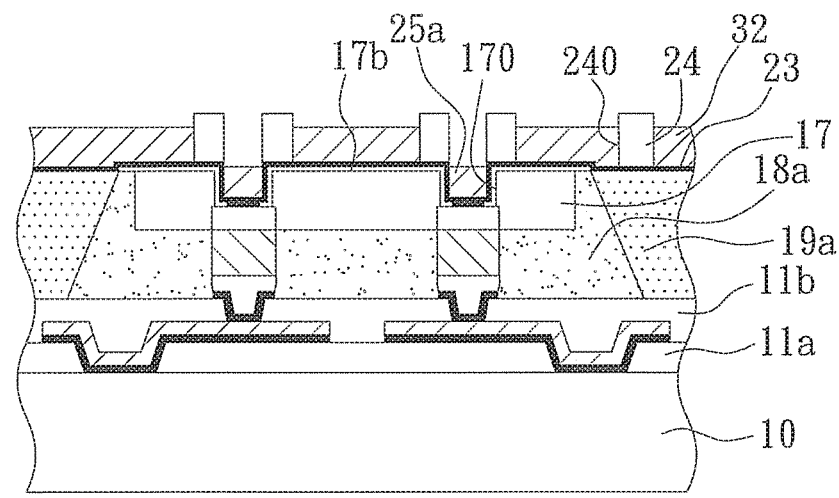
Figure 3:
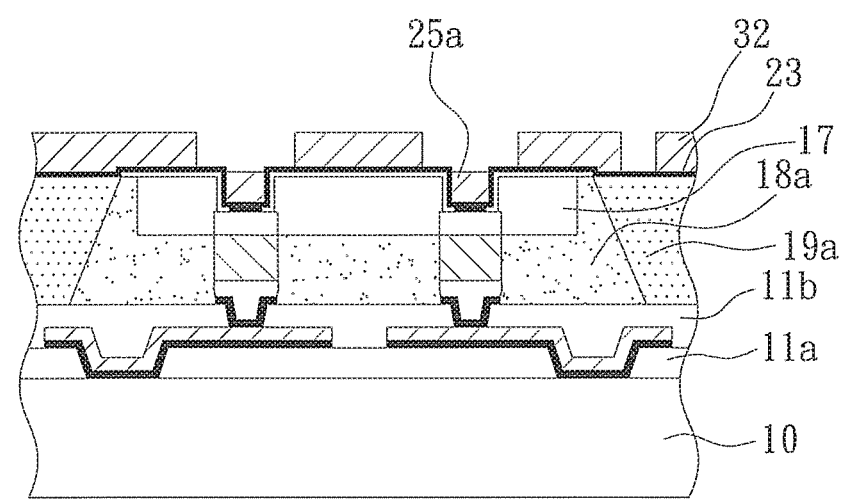
Figures 3, 4:
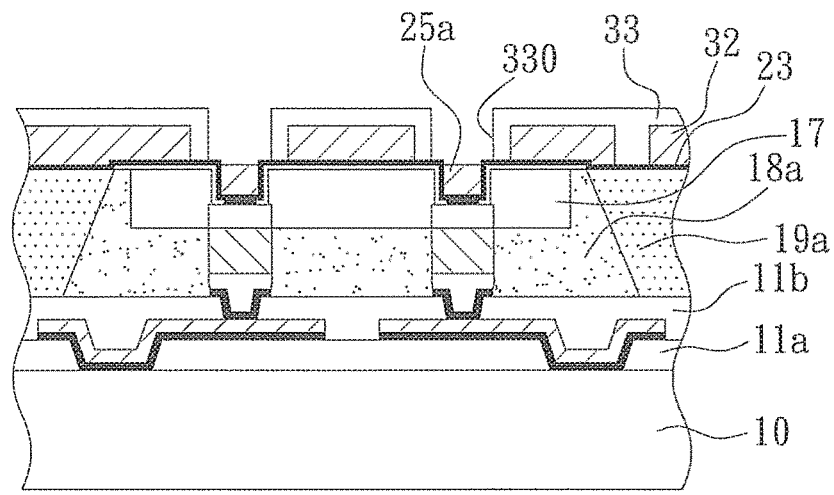
Figures 3, 4, 5:
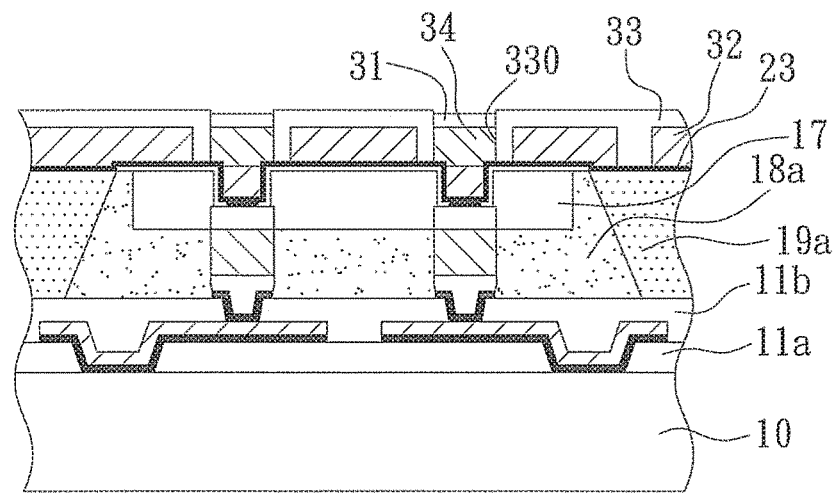
Figures 3, 4, 5, 6:
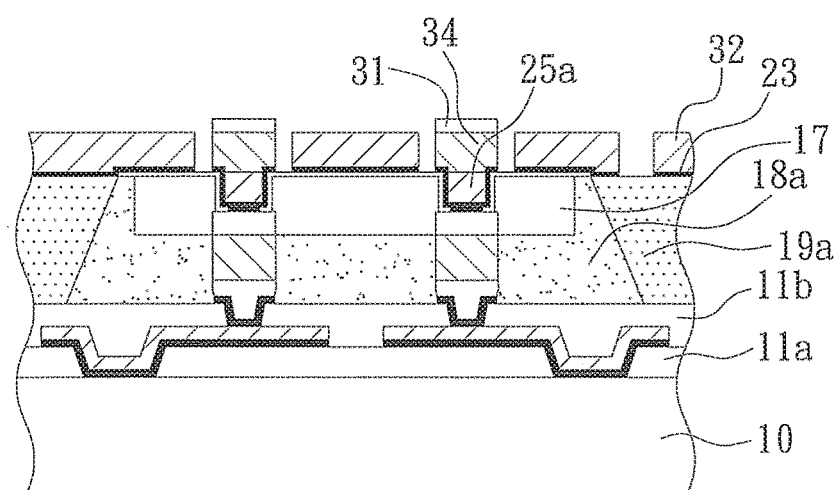
Figures 3, 4, 5, 6, 7:
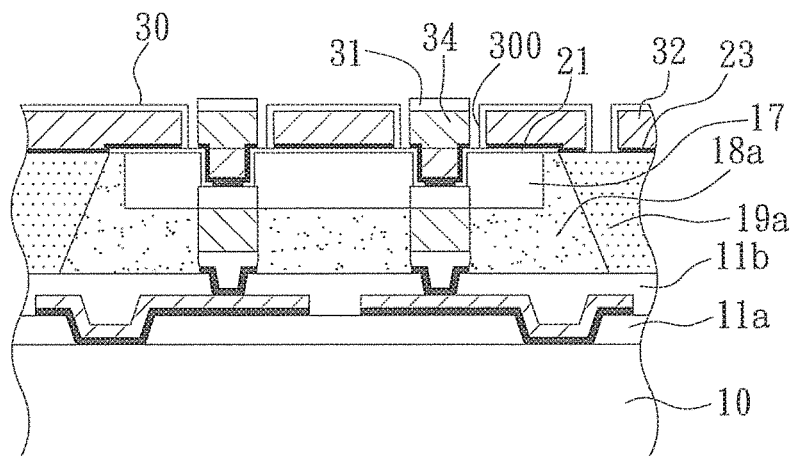
Figures 3, 4, 5, 6, 7, 8:
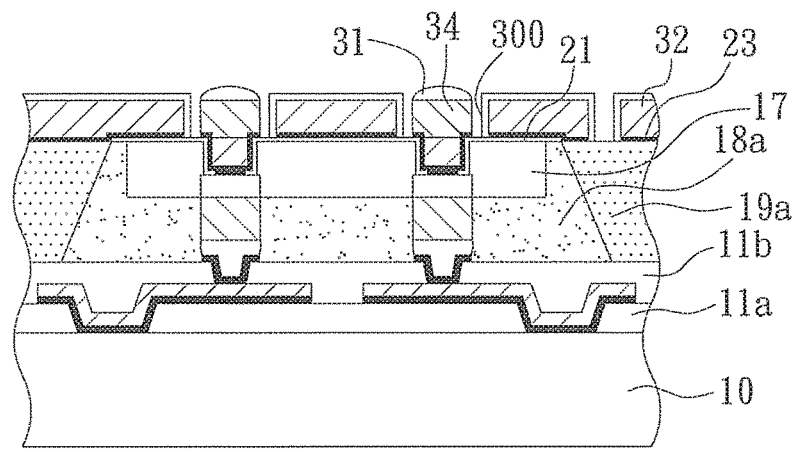
Figures 3, 4, 5, 6, 7, 8, 9:
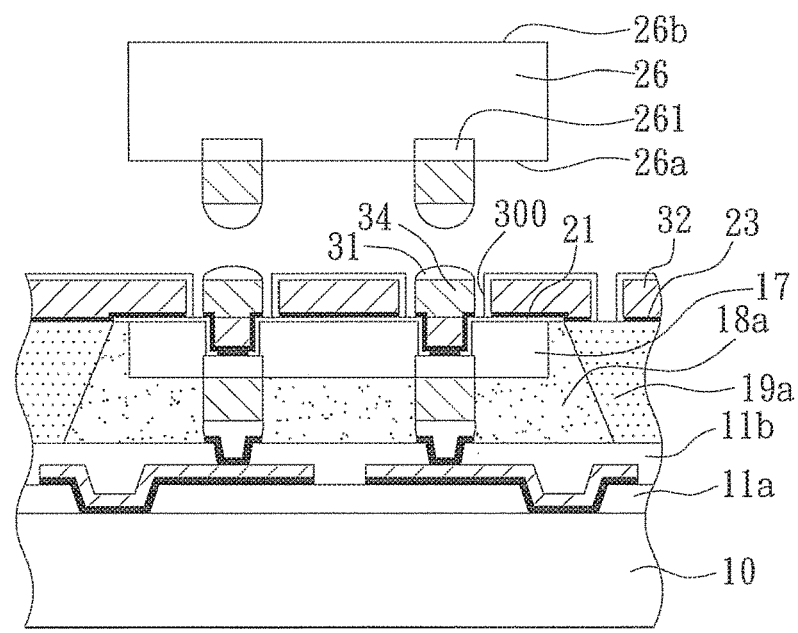
Figures 3, 4, 5, 6, 7, 8, 9, 10:
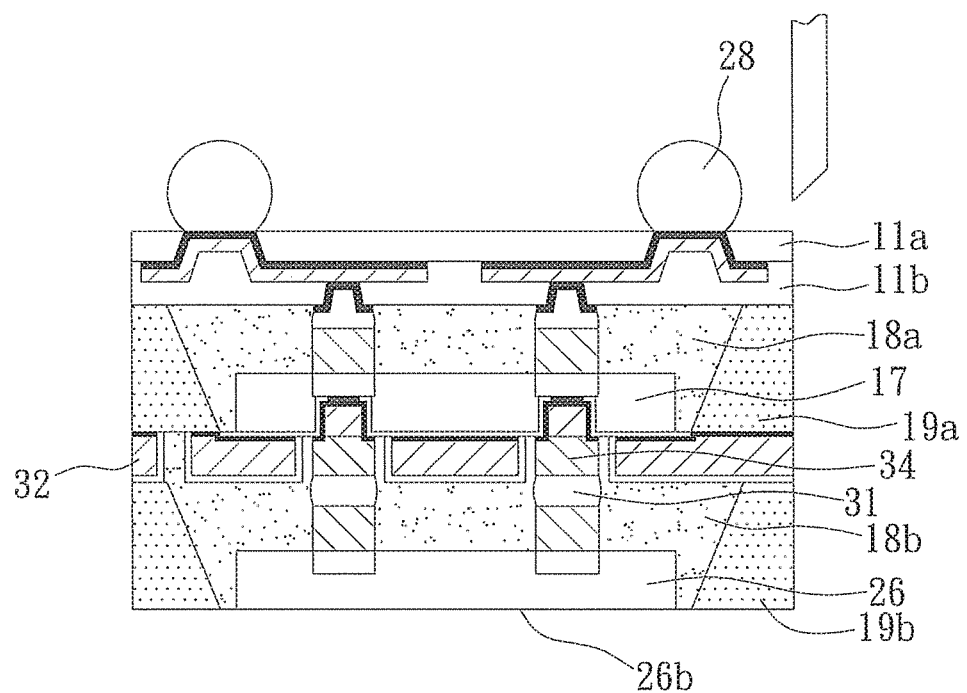
Figure 4:
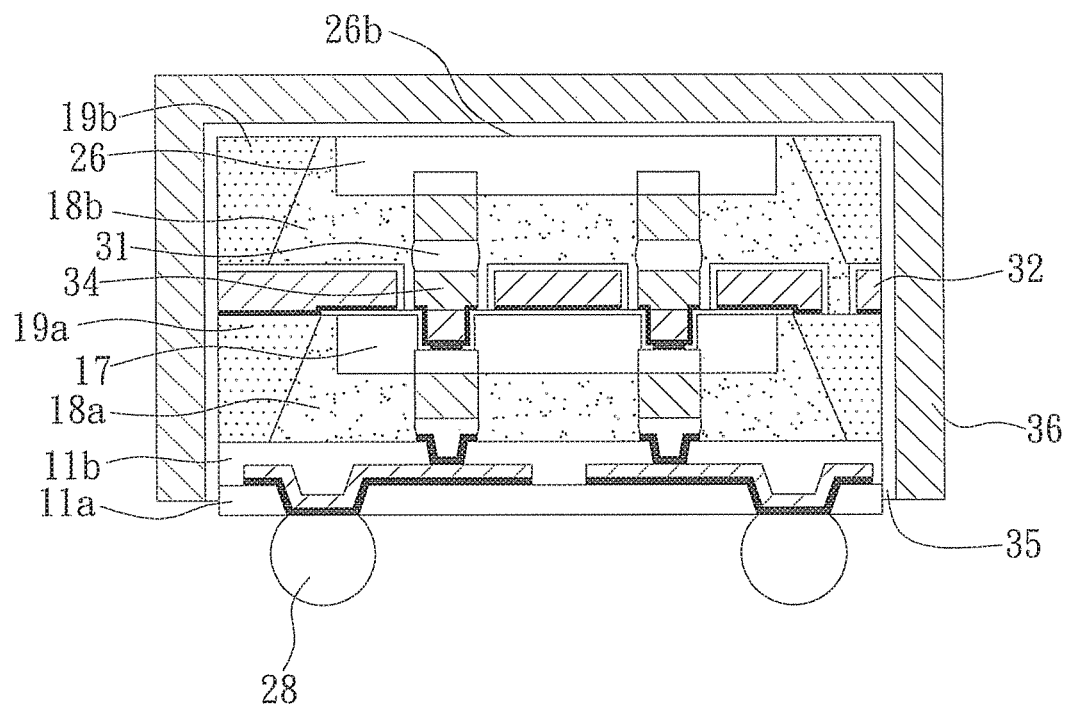
Figure 4:
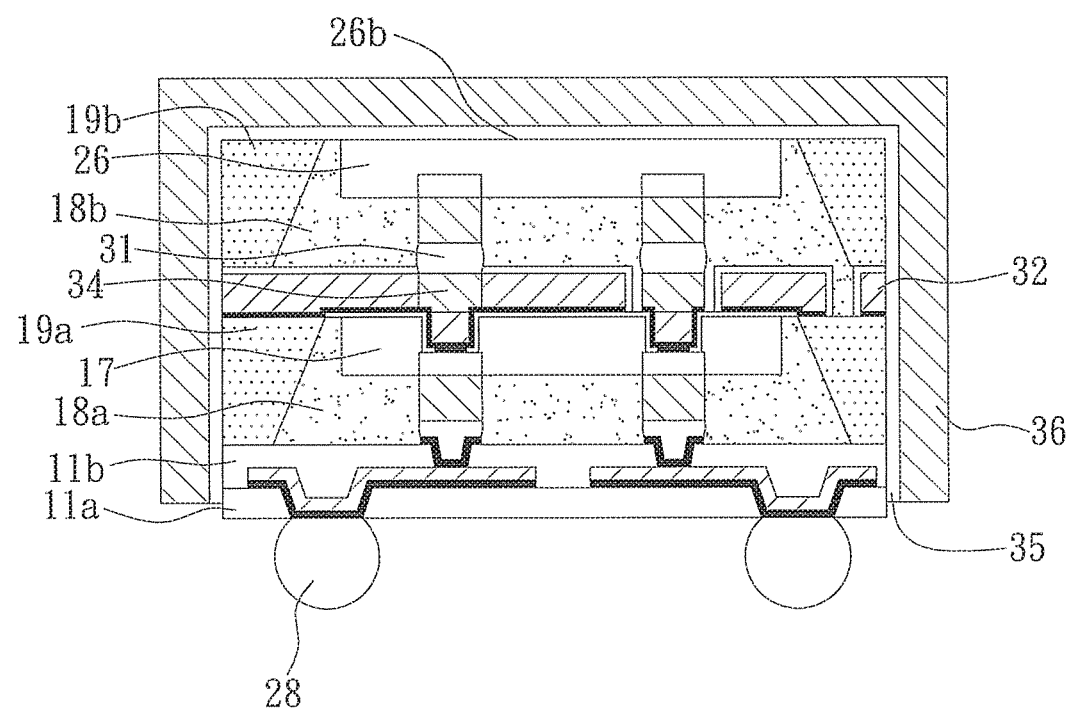
Figures 1, 5:
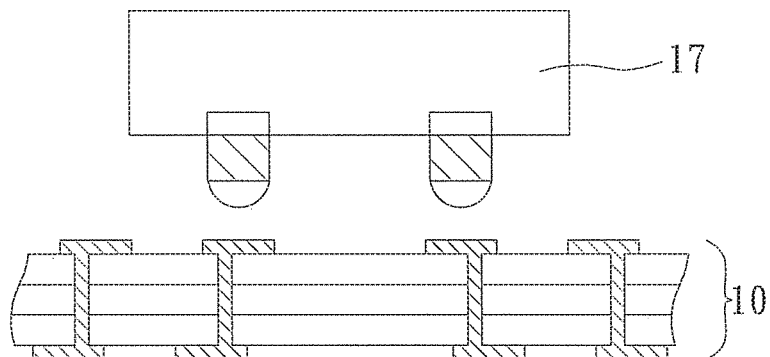
Figures 2, 5:
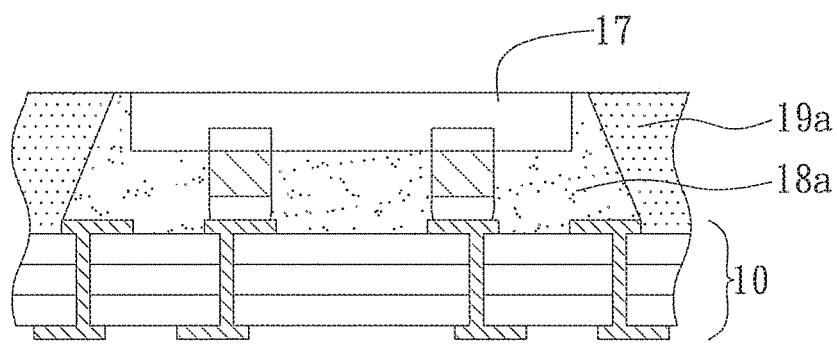
Figures 3, 5:
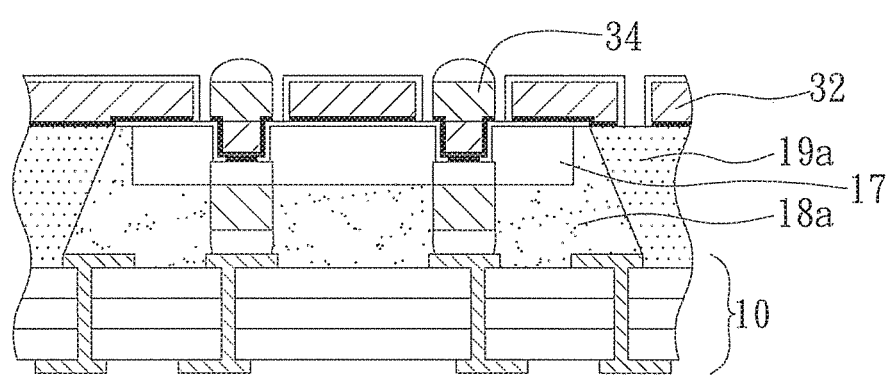
Figures 4, 5:
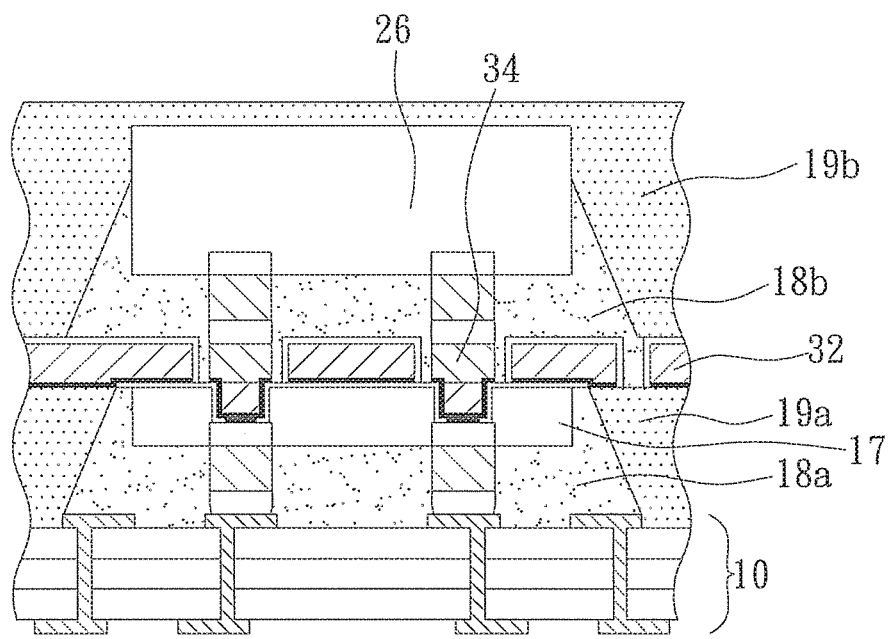
Figure 5:
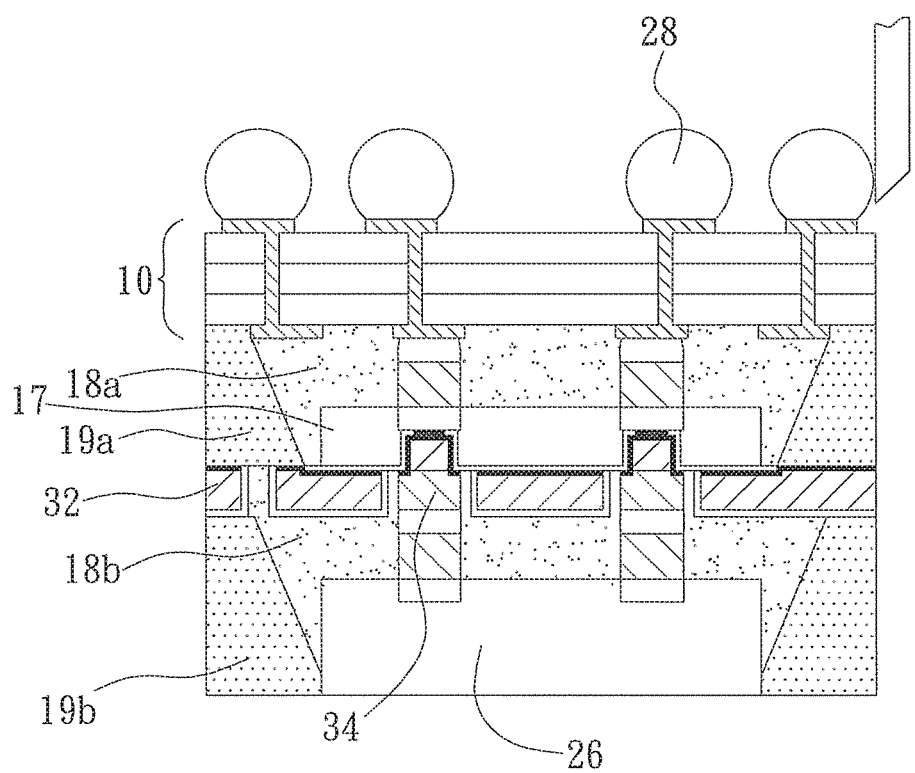
Figures 1, 6:
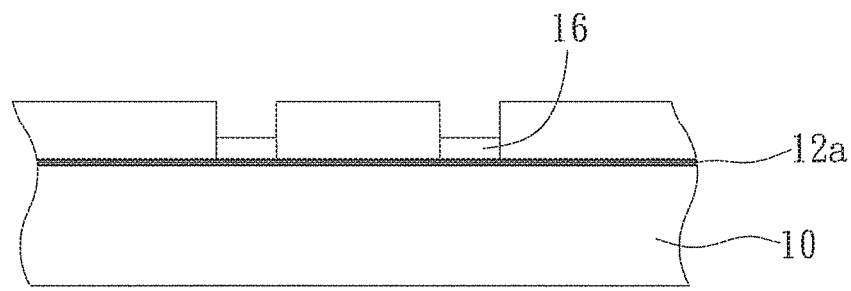
Figures 2, 6:
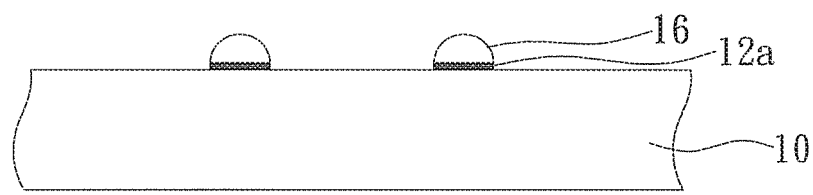
Figures 3, 6:
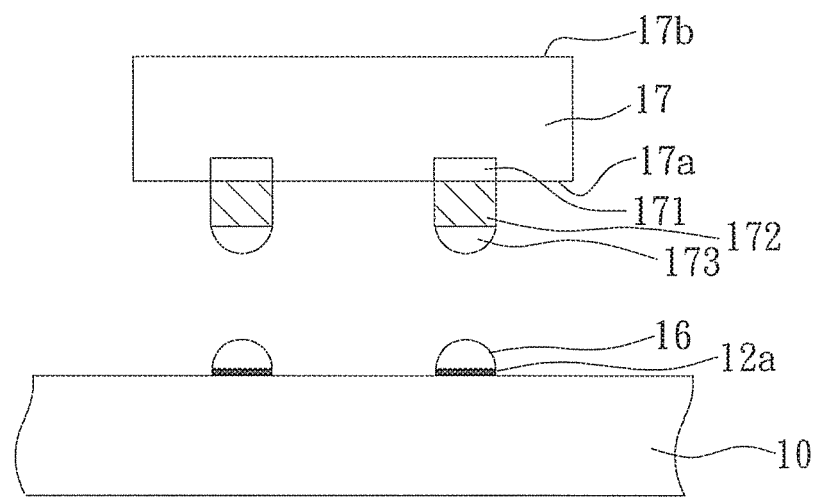
Figures 4, 6:
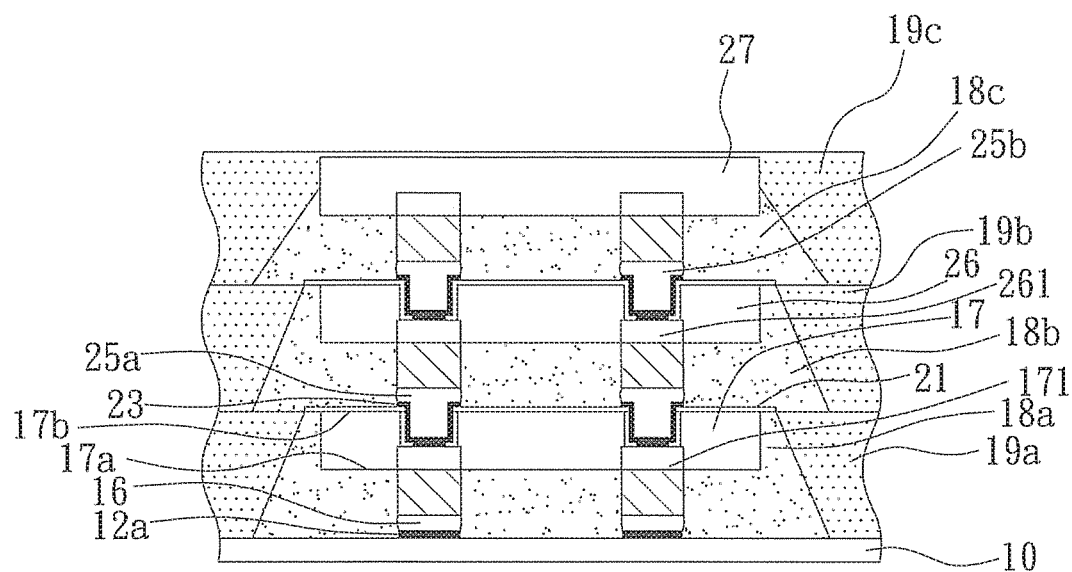
Figures 5, 6:
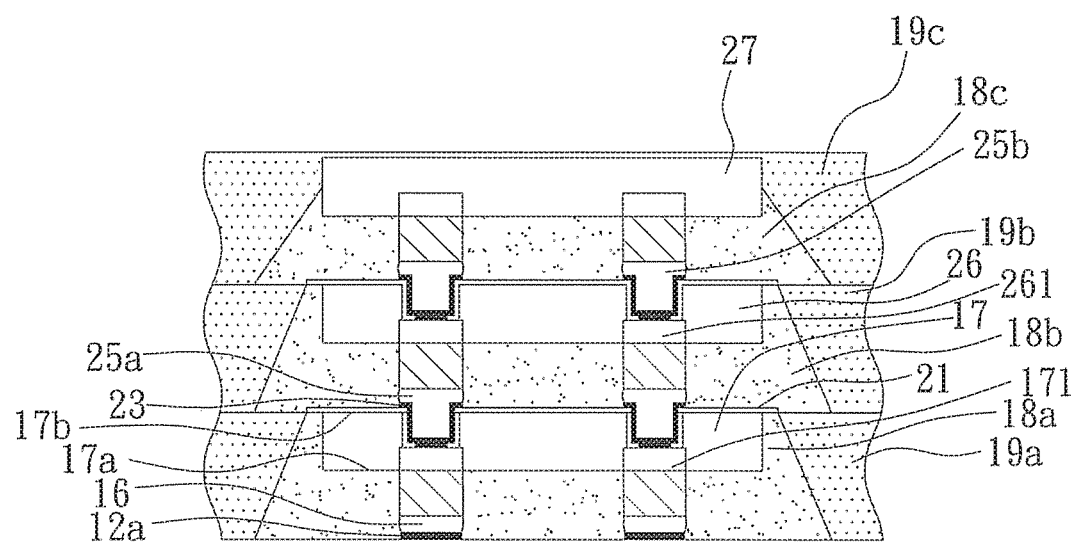
Figure 6:
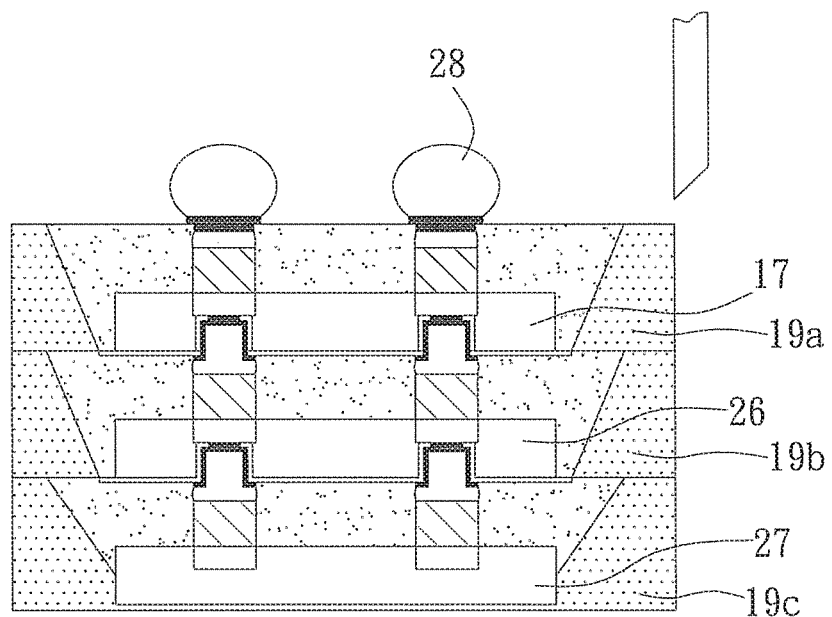
Figure 6:
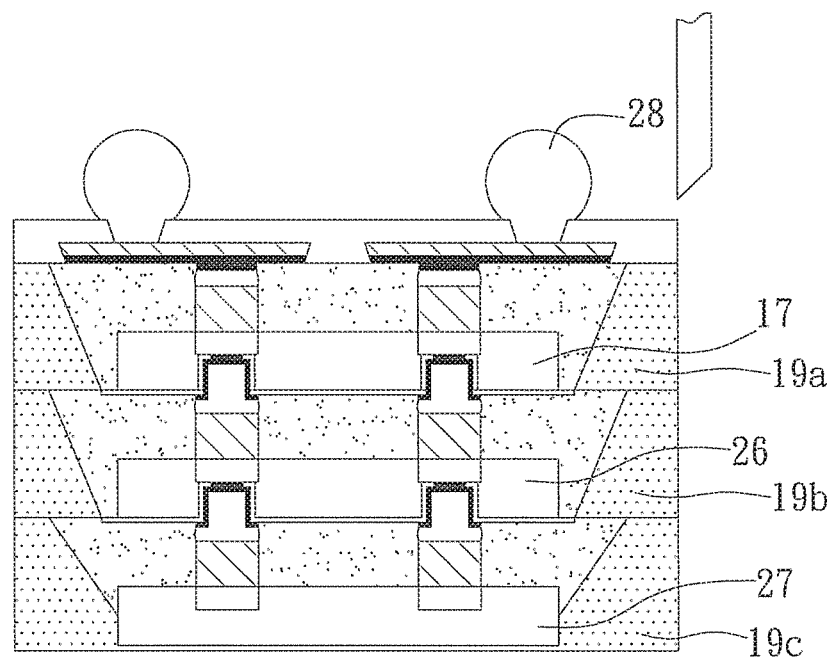
Figures 1, 7:
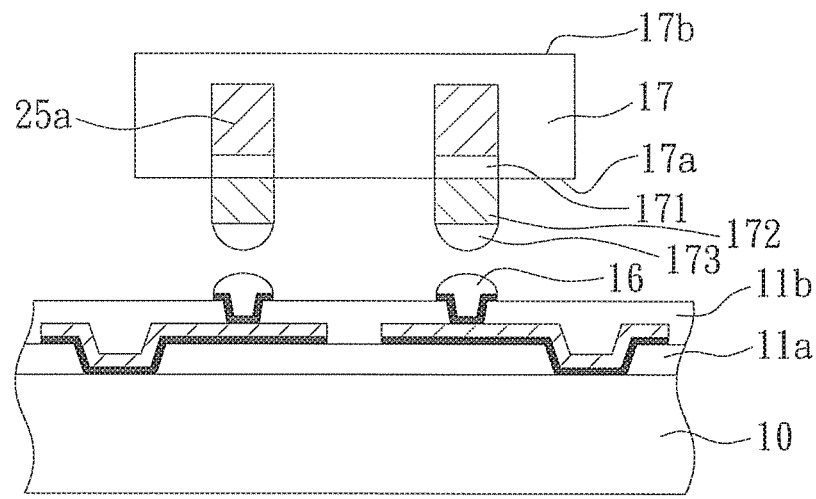
Figures 2, 7:
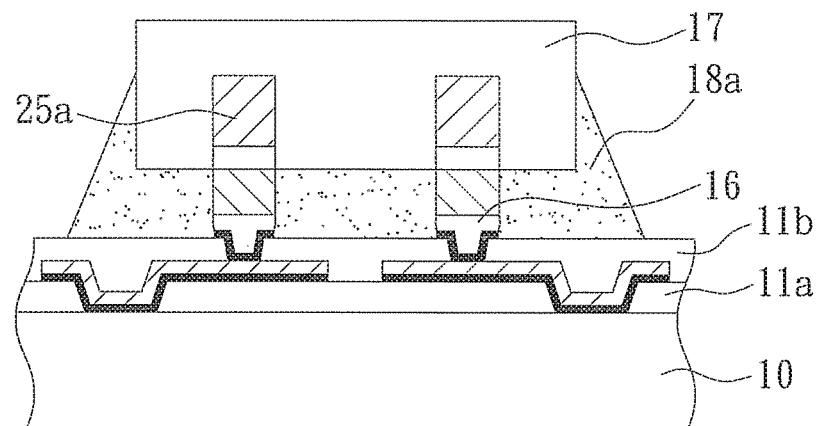
Figures 3, 7:
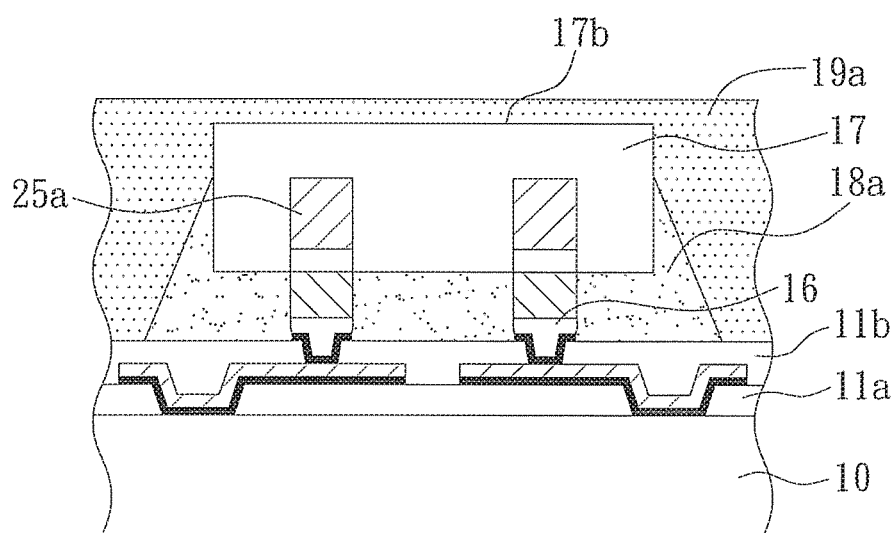
Figures 4, 7:
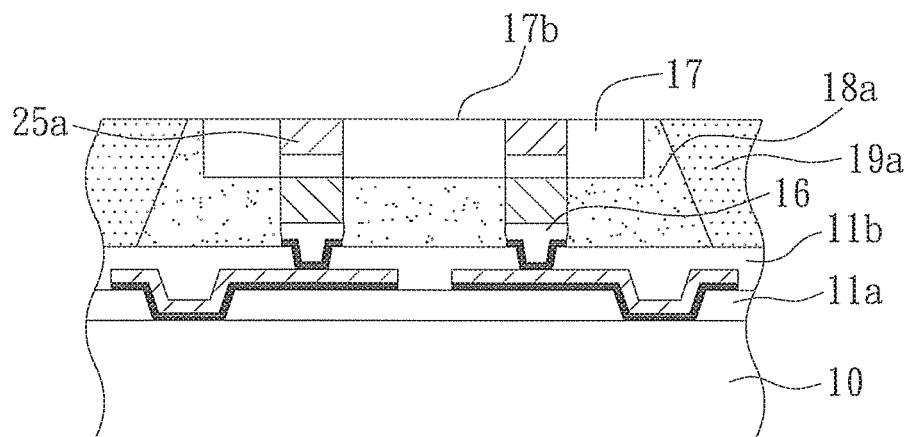
Figures 5, 7:
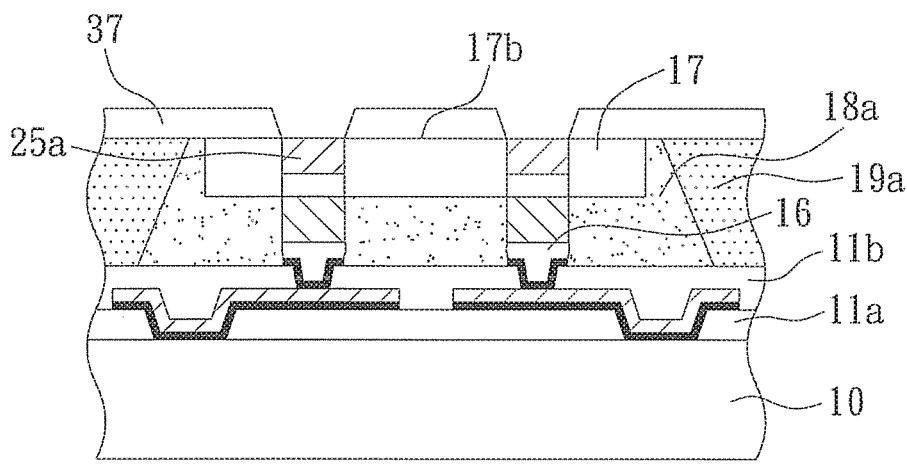
Figures 1, 8:
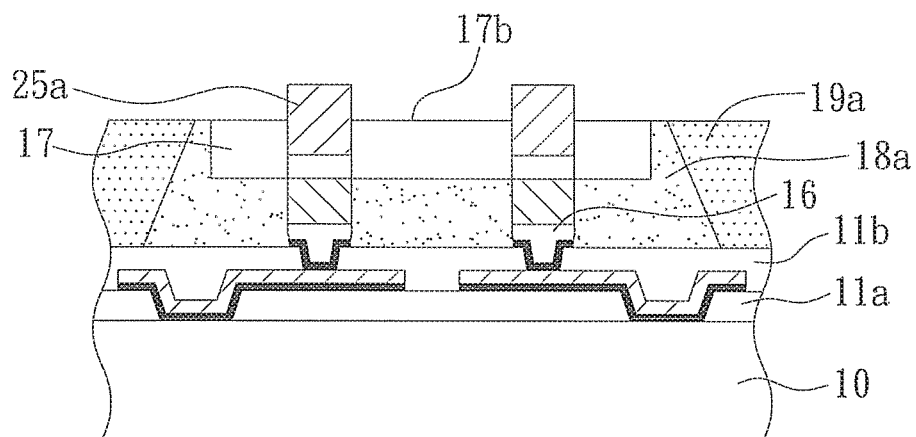
Figures 2, 8:
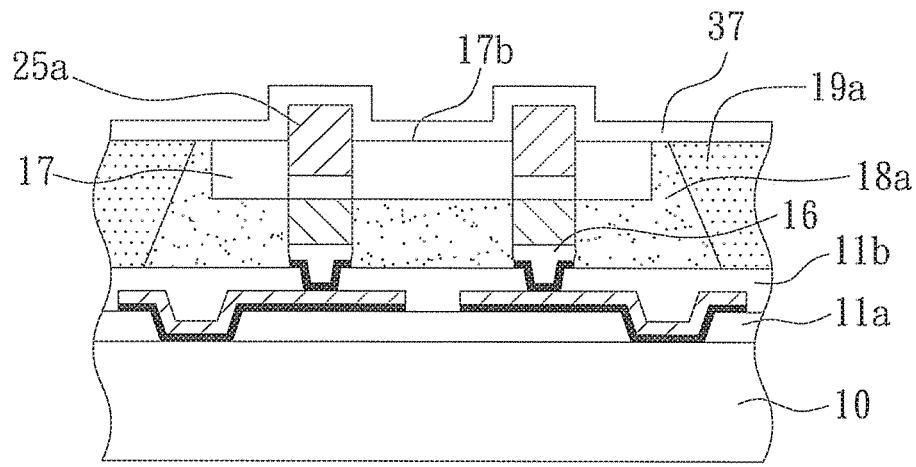
Figures 3, 8:
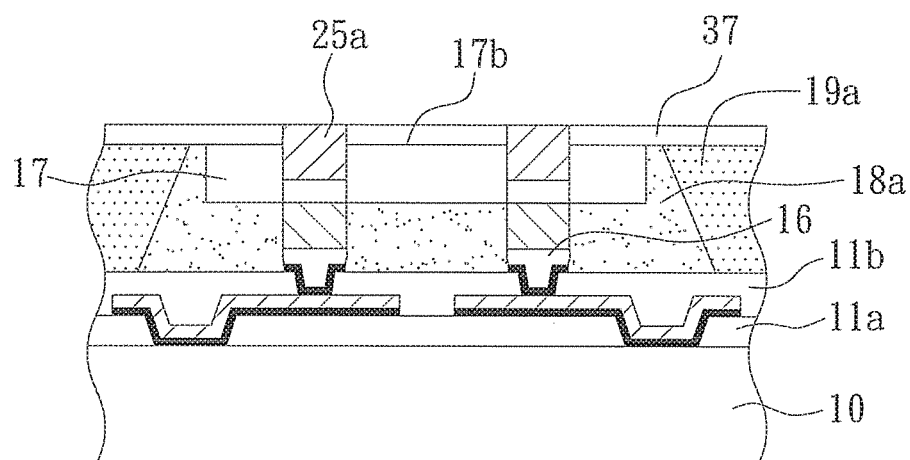

Alternatively, referring to FIGS. 8-1 to 8-3, only the first semiconductor chip 17 is thinned so as for the first bumps 25a to protrude above the first non-active surface 17b. Then, the fourth dielectric layer 37 is coated on the first non-active surface 17b, the first encapsulant 19a and the first bumps 25a, and a grinding process is performed to remove a portion of the first bumps 25a and the fourth dielectric layer 37 such that top ends of the first bumps 25a are exposed so as to be electrically connected to a semiconductor chip.

The first semiconductor chip 17 having the first bumps 25a can further be applied to the second to sixth embodiments. This can be readily understood by those skilled in the art upon reading the present disclosure and thus is not described further herein.

It should be noted that the semiconductor chips of the present invention can be bonded to other semiconductor chips or electronic elements through a solder material, a non-conductive paste (NCP), an anisotropic conductive film (ACF) or an anisotropic conductive paste (ACP). In other embodiments, only an underfill or encapsulant is formed to encapsulate the semiconductor chips or electronic elements. The present invention can alternatively use stacked semiconductor chips. Further, the conductive layer can be made of, but not limited to, Ti, Cu, Ni, V, Al, W, Au or a combination thereof. In addition, the electroplated Sn—Ag can comprise Cu/Ni/Ge.

The present invention further provides a semiconductor package, which has: a build-up structure having a plurality of conductive pads 131 exposed from a top surface thereof; a first semiconductor chip 17 disposed on the top surface of the build-up structure in a flip-chip manner, wherein the first semiconductor chip 17 has a first active surface 17a and a first non-active surface 17b opposite to the first active surface 17a, the first active surface 17a has a plurality of first electrode pads 171 electrically connected to the conductive pads 131, respectively, and a plurality of first through holes 170 are formed in the first semiconductor chip 17 via the non-active surface 17b thereof such that a plurality of first bumps 25a are formed in the first through holes 170 for electrically connecting the first electrode pads 171; an electronic element disposed on the first semiconductor chip 17 and electrically connected to the first bumps 25a; and an encapsulant formed on the top surface of the build-up structure for encapsulating the first semiconductor chip 17 and the electronic element.

The present invention provides another semiconductor package, which has: a carrier 10 having a plurality of conductive pads 131 exposed from a top surface thereof; a first semiconductor chip 17 disposed on the top surface of the carrier 10 in a flip-chip manner, wherein the first semiconductor chip 17 has a first active surface 17a and a first non-active surface 17b opposite to the first active surface 17a, the first active surface 17a has a plurality of first electrode pads 171 electrically connected to the conductive pads 131, respectively, a plurality of first through holes 170 are formed in the first semiconductor chip 17 via first non-active surface 17b thereof such that a plurality of first bumps 25a are formed in the first through holes 170 for electrically connecting to the first electrode pads 171, and a heat conducting layer 32 is further formed on the first non-active surface 17b of the first semiconductor chip 17; an electronic element disposed on the first semiconductor chip 17 and electrically connected to the first bumps 25a; and an encapsulant formed on the top surface of the carrier 10 for encapsulating the first semiconductor chip 17 and the electronic element.

In the above-described packages, the first electrode pads 171 are exposed through the first through holes 170, respectively. Alternatively, a circuit layer that is embedded in the first semiconductor chip 17 and electrically connected to the first electrode pads 171 is exposed through the first through holes 170. The first bumps can be made of one of Ni, Sn, Ag, Cu, Pd, Au, Al or a combination thereof.

In the above-described packages, the build-up structure has a plurality of bonding pads 121 exposed from a bottom surface thereof, and the carrier 10 can be a circuit board or a packaging substrate.

In the above-described packages, the electronic element is a semiconductor chip, a passive component or a semiconductor package. Each of the conductive pads 131 further has a second conductive layer 14 and a first solder material 16 sequentially formed thereon. A first underfill 18a is disposed between the first semiconductor chip 17 and the build-up structure, and a second underfill 18b is formed between the first semiconductor chip 17 and the second semiconductor chip 26.

In the above-described packages, the encapsulant further has a first body 19a encapsulating the first semiconductor chip 17 and a second body 19b encapsulating the second semiconductor chip 26.

In the above-described packages, a second semiconductor chip 26 is disposed between the first semiconductor chip 17 and the electronic element. A second circuit layer 29 is further formed on the first non-active surface 17b of the first semiconductor chip 17 and electrically connected to the first bumps 25a. The above-described package can further have a heat sink 36 attached to the encapsulant. The heat sink 36 can be U-shaped and a thermal adhesive can be disposed between the heat sink 36 and the encapsulant.

In the above-described packages, the first non-active surface 17b of the first semiconductor chip 17 further has a heat conducting layer 32 formed thereon, a heat sink 36 is attached to the encapsulant and connected to the heat conducting layer 32. Therefore, the present invention performs fabrication processes directly on a carrier and eliminates the need to debond the wafer as in the prior art so as to improve the product yield. The product yield is further improved by allowing an electrical test to be performed to the carrier so as for good dies to be disposed on the carrier at positions where no electrical performance failure occurs. Furthermore, since the semiconductor chip is thinned after it is disposed on the carrier, the present invention overcomes the conventional difficulties in stacking or bonding steps. Moreover, the carrier can be removed to reduce the thickness of the overall package. In addition, a heat conducting layer and a heat sink can be provided to improve the heat dissipating efficiency.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:
1. A fabrication method of a semiconductor package, comprising the steps of:
providing a carrier having a first surface with a plurality of conductive pads and a second surface opposite to the first surface;
disposing a first semiconductor chip on the first surface of the carrier in a flip-chip manner, wherein the first semiconductor chip has a first active surface and a first non-active surface opposite to the first active surface, and the first active surface has a plurality of first electrode pads electrically connected to the conductive pads, respectively;
thinning the first semiconductor chip from the first non-active surface thereof;
forming a plurality of first through holes in the first semiconductor chip via the first non-active surface thereof;
forming in the first through holes a plurality of bumps electrically connected to the first electrode pads, and forming a heat conducting layer on the first non-active surface of the first semiconductor chip, wherein a solder material is formed on and in direct contact with the bumps;
disposing an electronic element on the first semiconductor chip and electrically connecting the electronic element and the bumps; and forming on the first surface of the carrier an encapsulant that encapsulates the first semiconductor chip and the electronic element.

2. The fabrication method of claim 1, wherein the first electrode pads are exposed through the first through holes, respectively.

3. The fabrication method of claim 1, wherein a circuit layer that is electrically connected to the first electrode pads is exposed through the first through holes.

4. The fabrication method of claim 1, wherein the bumps are formed through an electroplating process or an ENEPIG (Electroless Nickel Electroless Palladium Immersion Gold) process, or formed through solder paste print and reflow.

5. The fabrication method of claim 1, wherein the electronic element is a semiconductor chip, a passive component or a semiconductor package.

6. The fabrication method of claim 1, wherein the carrier is a circuit board or a packaging substrate.

7. The fabrication method of claim 1, wherein the encapsulant further comprises a first body encapsulating the first semiconductor chip and a second body encapsulating the electronic element.

8. The fabrication method of claim 1, further comprising disposing a second semiconductor chip between the first semiconductor chip and the electronic element.

9. The fabrication method of claim 1, further comprising forming on the first non-active surface of the first semiconductor chip a circuit layer electrically connected to the bumps.

10. The fabrication method of claim 1, further comprising attaching a heat sink to the encapsulant.

11. The fabrication method of claim 10, further comprising forming a thermal adhesive between the heat sink and the encapsulant.

12. The fabrication method of claim 1, further comprising attaching a heat sink to the encapsulant and connecting the heat sink to the heat conducting layer.

13. A fabrication method of a semiconductor package, comprising the steps of:
providing a carrier having a first surface with a plurality of conductive elements and a second surface opposite to the first surface;
disposing a first semiconductor chip on the first surface of the carrier in a flip-chip manner, wherein the first semiconductor chip has a first active surface and a first non-active surface opposite to the first active surface, and the first active surface has a plurality of first electrode pads electrically connected to the conductive elements, respectively;
thinning the first semiconductor chip from the first non-active surface thereof;
forming a plurality of first through holes in the first semiconductor chip via the first non-active surface thereof;
forming in the first through holes a plurality of first bumps made of solder electrically connected to the first electrode pads;
disposing an electronic element on the first semiconductor chip and electrically connecting the electronic element to the first bumps; and
forming on the first surface of the carrier an encapsulant that encapsulates the first semiconductor chip and the electronic element.

14. The fabrication method of claim 13, wherein the first electrode pads are exposed through the first through holes, respectively.

15. The fabrication method of claim 13, wherein a circuit layer that is electrically connected to the first electrode pads is exposed through the first through holes.

16. The fabrication method of claim 13, wherein the first bumps are formed through an electroplating process or an ENEPIG (Electroless Nickel Electroless Palladium Immersion Gold) process, or formed through solder paste print and reflow.

17. The fabrication method of claim 13, wherein the electronic element is a semiconductor chip, a passive component or a semiconductor package.

18. The fabrication method of claim 13, wherein the carrier is a silicon wafer, an aluminum coated wafer or a glass sheet.

19. The fabrication method of claim 13, wherein the encapsulant further comprises a first body encapsulating the first semiconductor chip and a second body encapsulating the electronic element.

20. The fabrication method of claim 13, further comprising disposing a second semiconductor chip between the first semiconductor chip and the electronic element.

21. The fabrication method of claim 13, further comprising forming on the first non-active surface of the first semiconductor chip a circuit layer electrically connected to the first bumps.

22. The fabrication method of claim 13, further comprising attaching a heat sink to the encapsulant.

23. The fabrication method of claim 22, further comprising forming a thermal adhesive between the heat sink and the encapsulant.

24. The fabrication method of claim 13, further comprising forming a heat conducting layer on the first non-active surface of the first semiconductor chip.

25. A fabrication method of a semiconductor package, comprising the steps of:
providing a carrier having opposite first and second surfaces, wherein a build-up structure is formed on the first surface of the carrier and has a plurality of conductive pads exposed from a top surface thereof;
disposing a first semiconductor chip on the build-up structure in a flip-chip manner, wherein the first semiconductor chip has a first active surface and a first non-active surface opposite to the first active surface, and the first active surface has a plurality of first electrode pads electrically connected to the conductive pads, respectively, and a plurality of first bumps made of solder are formed in the first semiconductor chip and electrically connected to the first electrode pads;
thinning the first semiconductor chip from the first non-active surface thereof so as to expose the first bumps;
disposing an electronic element on the first semiconductor chip and electrically connecting the electronic element and the first bumps; and
forming on the build-up structure an encapsulant that encapsulates the first semiconductor chip and the electronic element.

26. The fabrication method of claim 25, wherein the build-up structure has a plurality of bonding pads in contact with the first surface of the carrier, and the method further comprises removing the carrier to expose the bonding pads.

27. The fabrication method of claim 25, wherein the electronic element is a semiconductor chip, a passive component or a semiconductor package.

28. The fabrication method of claim 25, wherein the carrier is a silicon wafer, an aluminum coated wafer or a glass sheet.

29. The fabrication method of claim 25, wherein each of the conductive pads further comprises a first solder material or an ENEPIG layer formed thereon.

30. The fabrication method of claim 25, wherein the encapsulant further comprises a first body encapsulating the first semiconductor chip and a second body encapsulating the electronic element.

31. The fabrication method of claim 25, further comprising disposing a second semiconductor chip between the first semiconductor chip and the electronic element.

32. The fabrication method of claim 25, further comprising forming on the first non-active surface of the first semiconductor chip a circuit layer electrically connected to the first bumps.

33. The fabrication method of claim 25, further comprising attaching a heat sink to the encapsulant.

34. The fabrication method of claim 33, further comprising forming a thermal adhesive between the heat sink and the encapsulant.

35. The fabrication method of claim 25, further comprising forming a heat conducting layer on the first non-active surface of the first semiconductor chip.

* * * * *